(12) United States Patent
Ishiguro et al.

(10) Patent No.: US 11,094,857 B2
(45) Date of Patent: Aug. 17, 2021

(54) METHOD FOR MANUFACTURING LIGHTING DEVICE

(71) Applicant: ASAHI RUBBER INC., Saitama (JP)

(72) Inventors: Eiji Ishiguro, Saitama (JP); Takashi Kanahira, Saitama (JP); Masutsugu Tasaki, Saitama (JP); Naoya Mashiko, Saitama (JP)

(73) Assignee: ASAHI RUBBER INC., Saitama (JP)

( * ) Notice: Subject to any disclaimer, the term of this patent is extended or adjusted under 35 U.S.C. 154(b) by 19 days.

(21) Appl. No.: 16/496,289

(22) PCT Filed: Mar. 28, 2017

(86) PCT No.: PCT/JP2017/012718
§ 371 (c)(1),
(2) Date: Sep. 20, 2019

(87) PCT Pub. No.: WO2018/179105
PCT Pub. Date: Oct. 4, 2018

(65) Prior Publication Data
US 2020/0044122 A1 Feb. 6, 2020

(51) Int. Cl.
| | |
|---|---|
| *H01L 33/10* | (2010.01) |
| *H01L 33/50* | (2010.01) |
| *G01J 3/50* | (2006.01) |
| *H01L 25/075* | (2006.01) |
| *H05B 33/10* | (2006.01) |

(52) U.S. Cl.
CPC ............ *H01L 33/504* (2013.01); *G01J 3/505* (2013.01); *H01L 25/0753* (2013.01); *H05B 33/10* (2013.01); *H01L 2933/0041* (2013.01)

(58) Field of Classification Search
CPC ................ H01L 33/504; H01L 27/322; H01L 2933/0041; G01J 3/10; G01J 3/465; H05B 45/20
See application file for complete search history.

(56) References Cited

U.S. PATENT DOCUMENTS

| | | | |
|---|---|---|---|
| 10,073,294 B1* | 9/2018 | Lin ..................... | G06F 3/0412 |
| 2006/0018118 A1* | 1/2006 | Lee ..................... | H05B 31/50 |
| | | | 362/231 |
| 2010/0195103 A1* | 8/2010 | Styles .................. | G01J 3/10 |
| | | | 356/402 |

(Continued)

FOREIGN PATENT DOCUMENTS

| | | |
|---|---|---|
| JP | 2003-257224 A | 9/2003 |
| JP | 2011-222665 A | 11/2011 |

(Continued)

OTHER PUBLICATIONS

Jun. 6, 2017 International Search Report issued in International Application No. PCT/JP2017/012718.

*Primary Examiner* — Jaehwan Oh
(74) *Attorney, Agent, or Firm* — Oliff PLC

(57) ABSTRACT

Provided is a lighting device that emits light of a color that approximates the color of the surface of an object or the like. Disclosed is a method for manufacturing a lighting device, including the steps of: spectroscopically measuring a spectrum that constitutes a color of a measurement target; and adjusting a color of a light source such that an emission spectrum approximates the spectrum that constitutes the color of the measurement target.

5 Claims, 32 Drawing Sheets

```
step of spectroscopically
measuring spectrum that
constitutes color of measurement
```

```
step of adjusting color of light
source such that emission
spectrum approximates spectrum
that constitutes color of
measurement target
```

(56) References Cited

U.S. PATENT DOCUMENTS

| | | | |
|---|---|---|---|
| 2011/0228515 A1* | 9/2011 | Grajcar | F21S 8/006 |
| | | | 362/84 |
| 2012/0080944 A1* | 4/2012 | Recker | H05B 47/16 |
| | | | 307/25 |
| 2013/0221224 A1* | 8/2013 | Maksyutenko | G01N 21/61 |
| | | | 250/343 |
| 2014/0209944 A1* | 7/2014 | Kim | H01L 33/28 |
| | | | 257/89 |
| 2014/0293608 A1 | 10/2014 | Kanahira | |
| 2017/0238390 A1 | 8/2017 | Yamakawa et al. | |
| 2018/0010749 A1* | 1/2018 | Shirakawa | F21S 2/00 |
| 2018/0135813 A1* | 5/2018 | Yamakawa | C09K 11/7734 |
| 2019/0187489 A1* | 6/2019 | Valentine | G02C 7/104 |
| 2020/0284656 A1* | 9/2020 | Ogino | G01J 3/10 |

FOREIGN PATENT DOCUMENTS

| | | |
|---|---|---|
| JP | 2014-209617 A | 11/2014 |
| JP | 2015-028844 A | 2/2015 |
| JP | 2015-050122 A | 3/2015 |
| JP | WO2016/067609 A1 | 5/2016 |

\* cited by examiner

METHOD FOR MANUFACTURING LIGHTING DEVICE

TECHNICAL FIELD

The present invention relates to a method for manufacturing a lighting device for reproducing the color of the surface of an object or the like.

BACKGROUND ART

As one of the properties of light sources, a color rendering property is known as a characteristic that affects the appearance of the color of an object when a given light source illuminates the object. Natural light, which exhibits a continuous spectrum, is white light that is excellent in color rendering property of most precisely representing the appearance of the color of an object. On the other hand, pseudo white light, which is obtained through color adjustment by converting blue light of a blue light-emitting diode (LED) into yellow light using a YAG fluorescent substance or the like, and mixing blue light and yellow light, is inferior in color rendering property to natural light because the spectrum constituting the white color is discontinuous even if only the chromaticity coordinates are matched with those of natural light. A technique is also known by which a fluorescent substance that emits red or green fluorescence is added in order to improve the color rendering property of pseudo white light.

Meanwhile, the effects of light colors on human psychology have been studied in recent years. Then, using the results of the studies, lighting devices having a relaxation effect also have been proposed. For example, PTL 1 listed below discloses, an incandescent lamp, a fluorescent lamp, and an LED lighting device, each having a light color with a high relaxation effect, and as a luminaire, an LED lighting device including two or more light-emitting diodes (LEDs), wherein one of the light-emitting diodes has a dominant wavelength emission band of 380 nm to 505 nm, and another one of the light-emitting diodes has a dominant wavelength emission band of 575 nm to 780 nm, and the chromaticity point of the color of the radiation light resulting from emission of the light-emitting diodes is present in a chromaticity range surrounded by a boundary line formed by connecting, by a straight line, (u', v')=(0.33, 0.485),(0.31, 0.517),(0.28, 0.51),(0.265, 0.5),(0.259, 0.491),(0.253, 0.465), and (0.305, 0.479) on a CIE 1976 u'v' chromaticity diagram.

In addition, for example, PTL 2 listed below discloses, as a thin lighting device capable of achieving uniform cherry blossom pink lighting, a lighting device in which a plurality of daylight-color light sources that emit daylight-color light, a plurality of incandescent-color light sources that emit incandescent-color light, and a plurality of red light sources that emit red light are disposed at predetermined positions. PTL 2 also discloses that a lighting device having emission spectra of the colors of a Yoshino cherry blossom and a double-flowered cherry blossom were obtained using such a lighting device.

CITATION LIST

Patent Literatures

[PTL 1] Japanese Laid-Open Patent Publication No. 2003-257224

[PTL 2] Japanese Laid-Open Patent Publication No. 2015-50122

SUMMARY OF INVENTION

Technical Problem

It has been empirically recognized by many people that sunlight, which exhibits a continuous spectrum, gives a cheerful and positive impression to a person. It has also been empirically recognized that moonlight, which exhibits a continuous reflection spectrum different from the continuous spectrum of sunlight, gives impressions such as serenity, calm, and stability to a person. On the other hand, pseudo white light, such as a commonly used white LED, which exhibits a discontinuous emission spectrum, is light of an artificially adjusted color, which is adjusted to be suitable for operations at offices, and thus is not light of a color that has been obtained through color adjustment taking psychological impressions on a person into consideration. As such, sunlight, moonlight, and pseudo white light give different impressions to a person due to subtle differences in color even though they are all white light. For example, PTL 2 proposes cherry blossom pink lighting in view of the effect on human psychology, based on that the cherry blossom pink of a Yoshino cherry blossom or a double-flowered cherry blossom gives a healing effect to a person. However, the cherry blossom pink color proposed in PTL 2 is obtained by reproducing a resembling color on the chromaticity coordinates, but not by reproducing the reflection spectrum exhibited by the original color of a cherry blossom.

It is an object of the present invention to provide a lighting device that emits light of a color that approximates the color of an object or the like.

Solution to Problem

One aspect of the present invention is directed to a method for manufacturing a lighting device, including the steps of: spectroscopically measuring a spectrum that constitutes a color of a measurement target; and adjusting a color of a light source such that an emission spectrum approximates the spectrum that constitutes the color of the measurement target. In such a method for manufacturing a lighting device, it is possible to manufacture a lighting device that resembles the color of a measurement target by measuring the spectrum that constitutes the color of the measurement target, and adjusting the color of the light of the light source by adjusting the emission spectrum so as to approximate the aforementioned spectrum of a measurement target.

In the above-described manufacturing method, examples of the measurement target include a plant, a star, the sky, and a water surface. In particular, the colors of the moon, the colors of the sky, the colors of petals, and the like are well known to people, and thus can give impressions more familiar to human psychology than artificially selected colors. When the measurement target is an object, it is preferable to measure a reflection spectrum for natural light because the color of the light of the light source can be adjusted to the original color of the object.

It is preferable that the light source includes an LED element, and two or more fluorescent substances having fluorescent wavelength peaks separated from each other by 50 nm or more, because a broad continuous wavelength composite spectrum can be easily formed.

It is preferable that the LED element is an ultraviolet LED element or a near-ultraviolet LED element having an emission peak in an ultraviolet light region of 430 nm or less, and at least one of the fluorescent substances is a blue to a green fluorescent substance that can be excited by ultraviolet light or near-ultraviolet light emitted by the ultraviolet LED element or the near-ultraviolet LED element, and that has a fluorescent wavelength peak in the range of 420 to 480 nm. When blue light is emitted using a blue LED element, the emission tends to result in a discontinuous composite spectrum because the emission wavelength of a commonly used blue LED element exhibits a sharp spectrum having a narrow width. In such a case, instead of emitting blue light using a blue LED element, it is preferable to emit blue light using a blue fluorescent substance or a green fluorescent substance that can be excited by ultraviolet light or near-ultraviolet light, each of which does not give a stimulus as visible light to the optic nerves, and that has a fluorescent wavelength peak in the range of 420 to 480 nm, because a spectrum having a broad peak with a broad skirt in the blue region, rather than blue light having a sharp wavelength typical to a blue LED element, can be obtained, so that, in the case of adjusting the color of the light of the light source to a desired color, it is possible to facilitate the use of the color of blue as an element, stimulating the optic nerve that recognizes the color of blue, while suppressing the height of the peak attributed to the emission of blue light.

It is preferable that the LED element is a blue LED element having an emission wavelength peak in the range of 430 nm or more and less than 480 nm, or a green LED element having an emission wavelength peak in the range of 480 nm or more and 550 nm or less, because they cause less emission of ultraviolet light or near-ultraviolet light, each of which affects the human body.

Advantageous Effects of Invention

According to the present invention, it is possible to provide a lighting device that emits light of a color that approximates the color of an object.

DESCRIPTION OF EMBODIMENT

An embodiment of a method for manufacturing a lighting device according to the present invention will be described.

Figure 1:
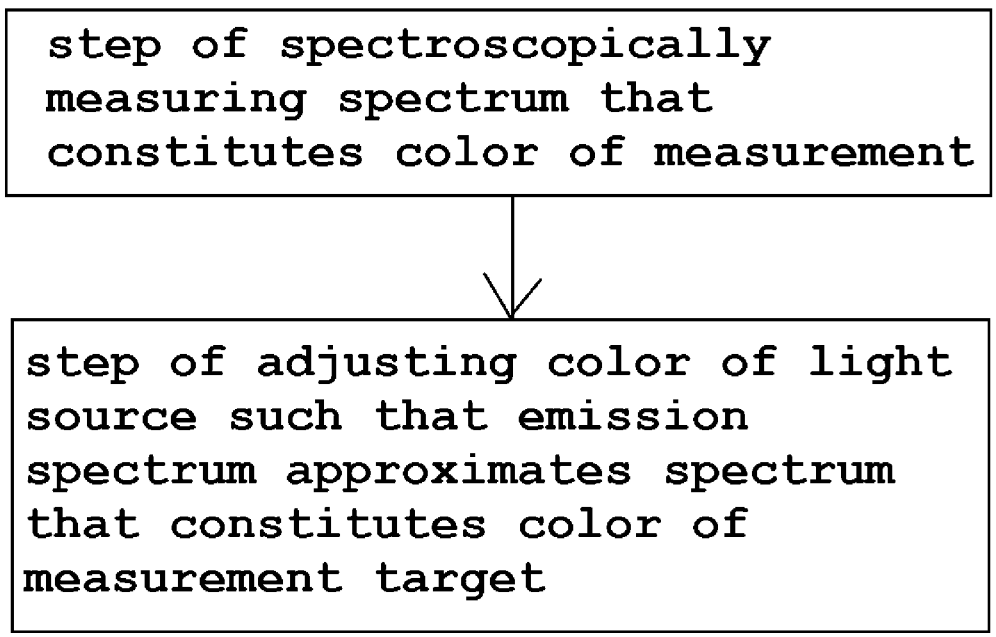
FIG. 1 shows a flowchart of a method for manufacturing a lighting device according to an embodiment of the present invention.

As shown in FIG. 1, a method for manufacturing a lighting device according to the present embodiment includes the steps of: spectroscopically measuring a spectrum that constitutes a color of a measurement target; and adjusting a color of a light source such that an emission spectrum approximates the spectrum that constitutes the color of the measurement target.

The step of spectroscopically measuring a spectrum that constitutes a color of a measurement target is a step of acquiring a spectrum such as a reflection spectrum by spectroscopically analyzing the surface of various measurement objects using a spectrum analyzing apparatus.

The measurement target in the manufacturing method of the present embodiment is not particularly limited, as long as a measurement object exhibits a spectrum that constitutes the color of the measurement object. Specific examples thereof include a portion of plants such as a flower, a leaf, and a grass, the sky, stars such as the moon, and water surfaces such as a lake surface and a sea surface. In particular, the colors of the moon, the colors of the sky, the colors of petals, and the like are well known to people, and thus can give impressions more familiar to human psychology than artificially selected colors.

Figure 2:
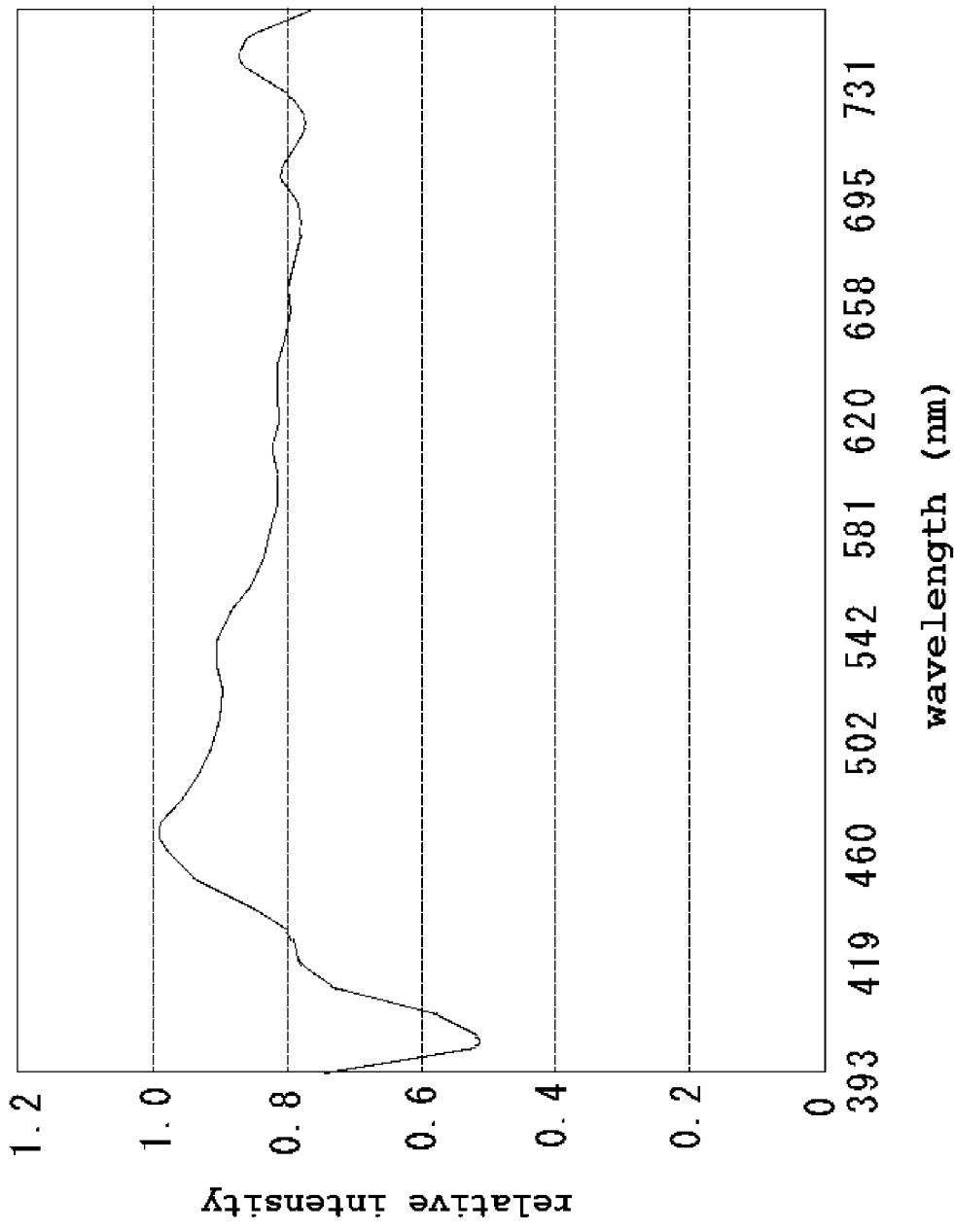
FIG. 2 shows a continuous spectrum of natural light (sunlight).

When the measurement target in the manufacturing method of the present embodiment is an object, it is preferable to measure a reflection spectrum for natural light because the original color of the object can be specified. Although natural light is sunlight, the radiation spectrum of sunlight varies depending on changes in time and weather, and variations in seasons. In the present embodiment, for the time and the weather, and variations in seasons, a preferable condition may be selected according to the purpose. An example of the radiation spectrum of sunlight is shown in FIG. 2.

The measurement apparatus for measuring a spectrum that constitutes the color of a measurement target in the manufacturing method of the present embodiment is not particularly limited as long as the measurement apparatus can acquire a spectrum by measuring the reflectance at each of the wavelengths that constitute the color of a measurement target in the visible light wavelength range of about 360 to 830 nm, for example. Specifically, it is possible to use a spectral radiance luminance meter or a color luminance meter. With such a measurement apparatus, it is also possible to determine tristimulus values or chromaticity coordinates in the XYZ colorimetric system by integrating the reflectance value (spectral distribution) multiplied with a color matching function.

Figure 3:
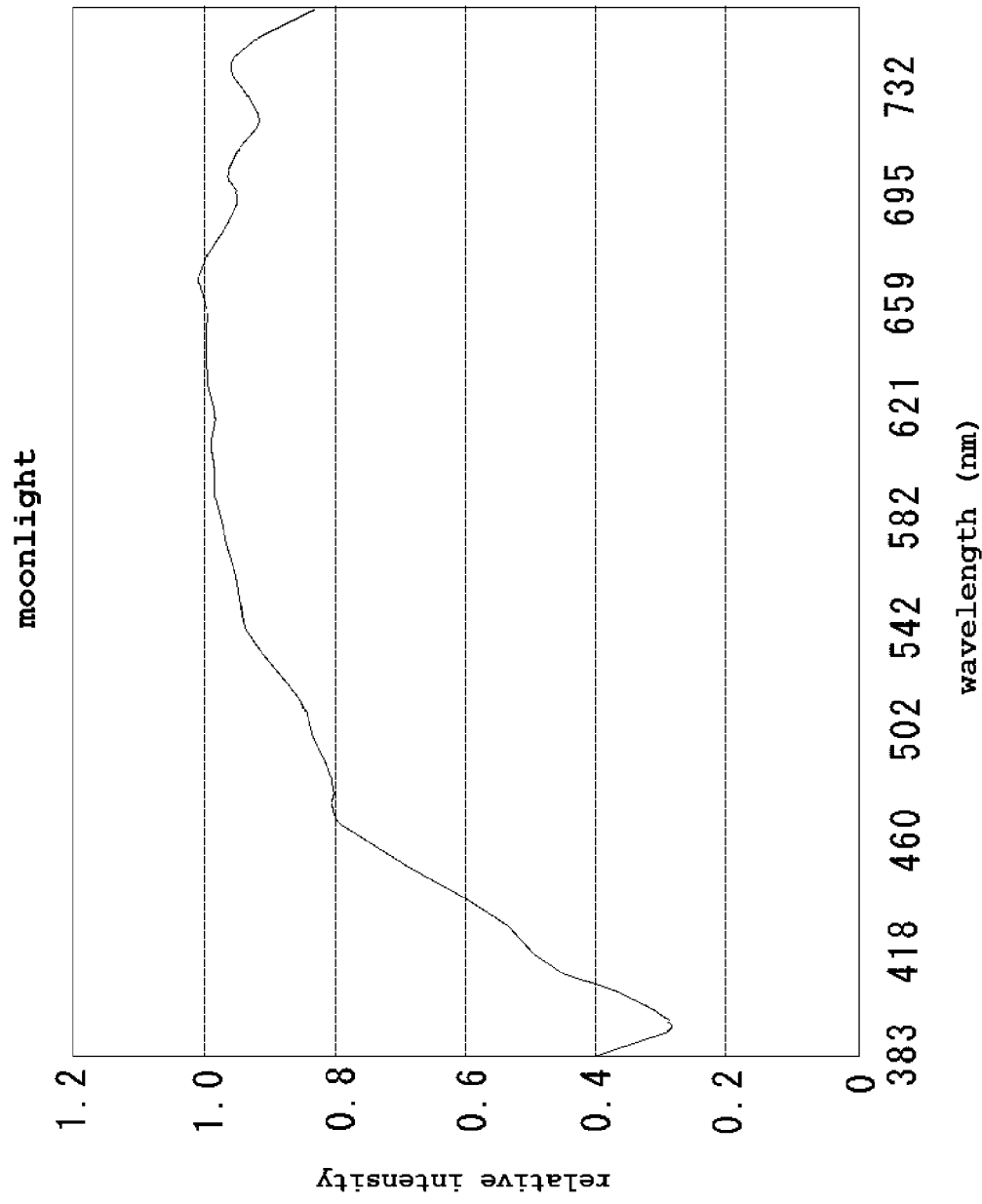
FIG. 3 shows a reflection spectrum of the moon for natural light.
Figure 6:
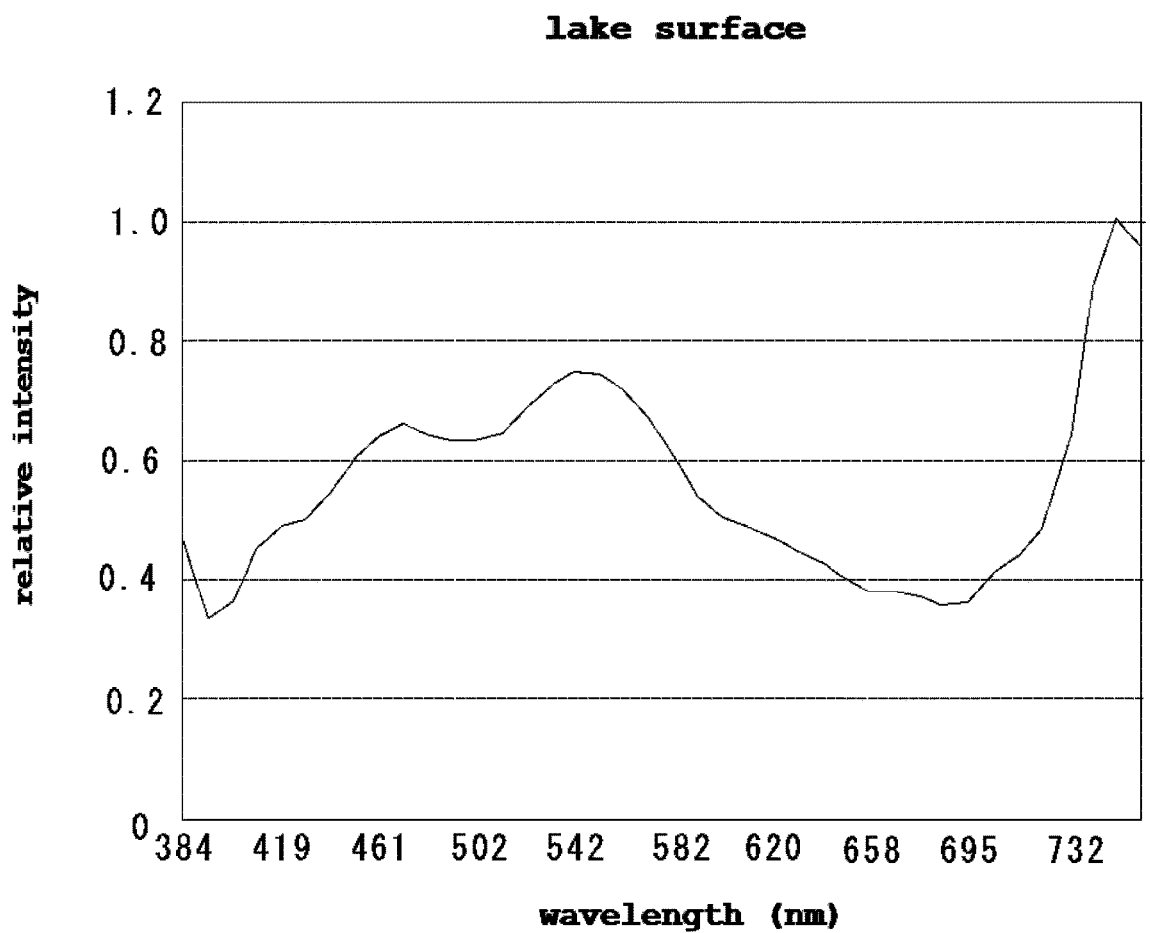
FIG. 6 shows a reflection spectrum of a lake surface for natural light.
Figure 9:
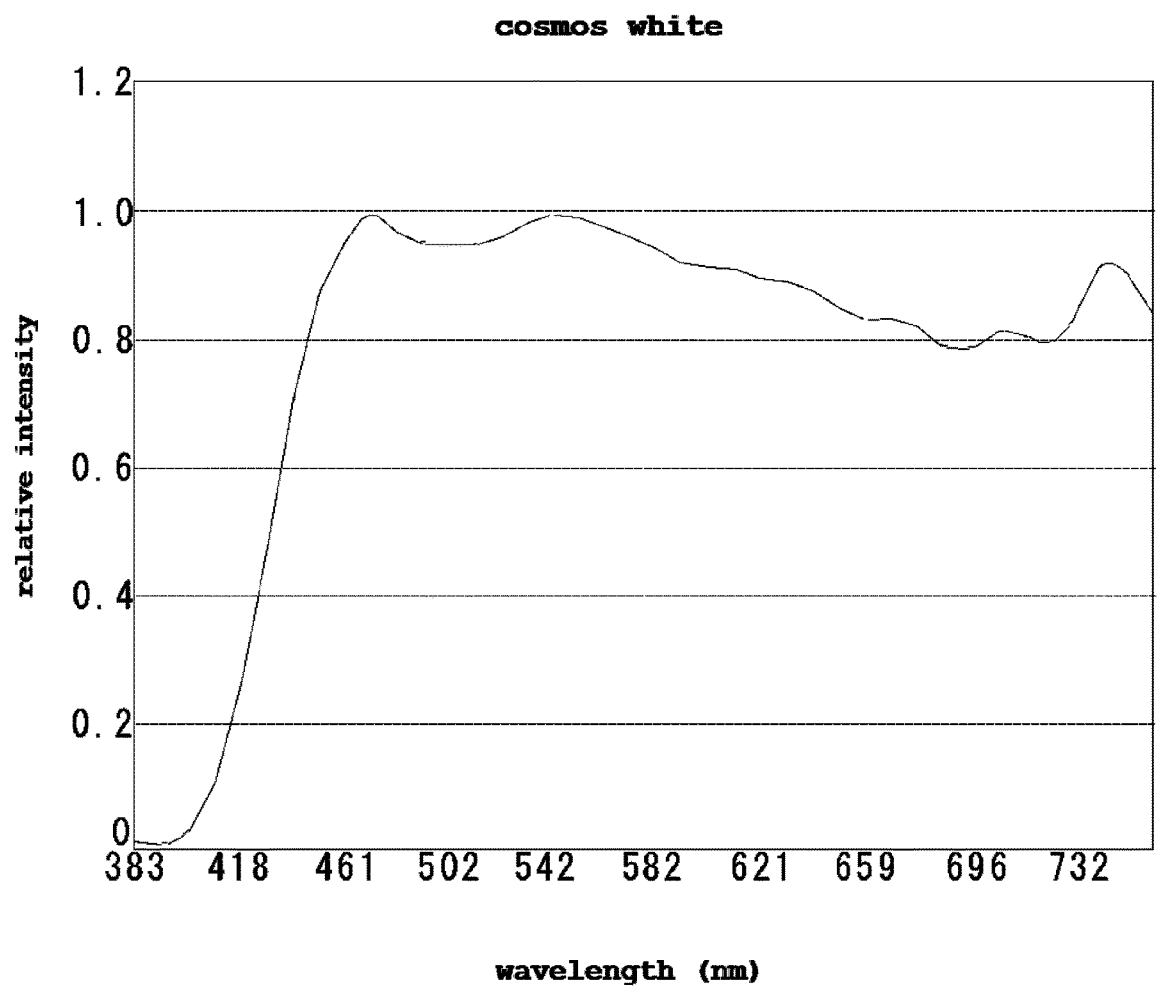
FIG. 9 shows a reflection spectrum of white cosmos petals for natural light.
Figure 12:
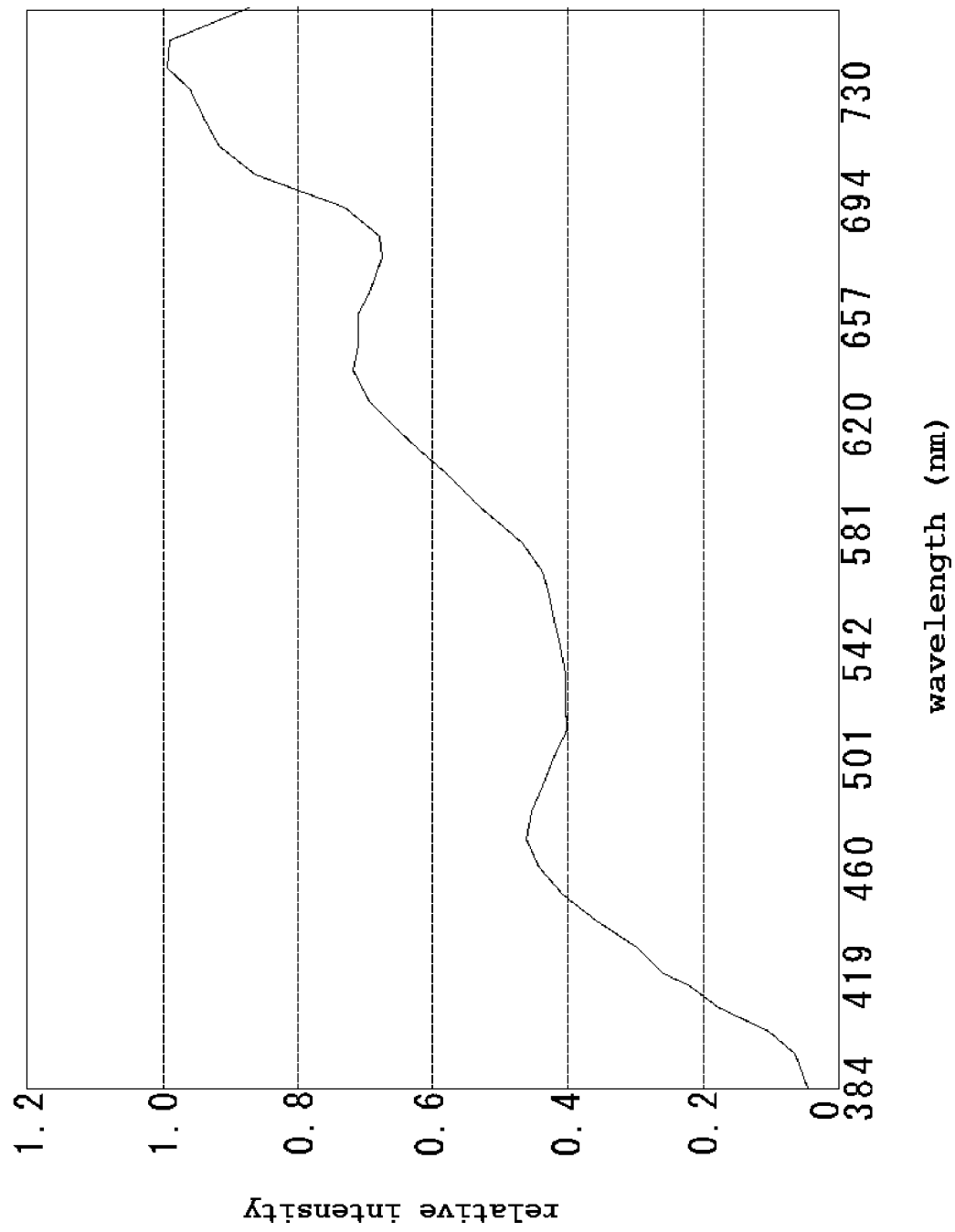
FIG. 12 shows a reflection spectrum of cherry blossom petals for natural light.
Figure 15:
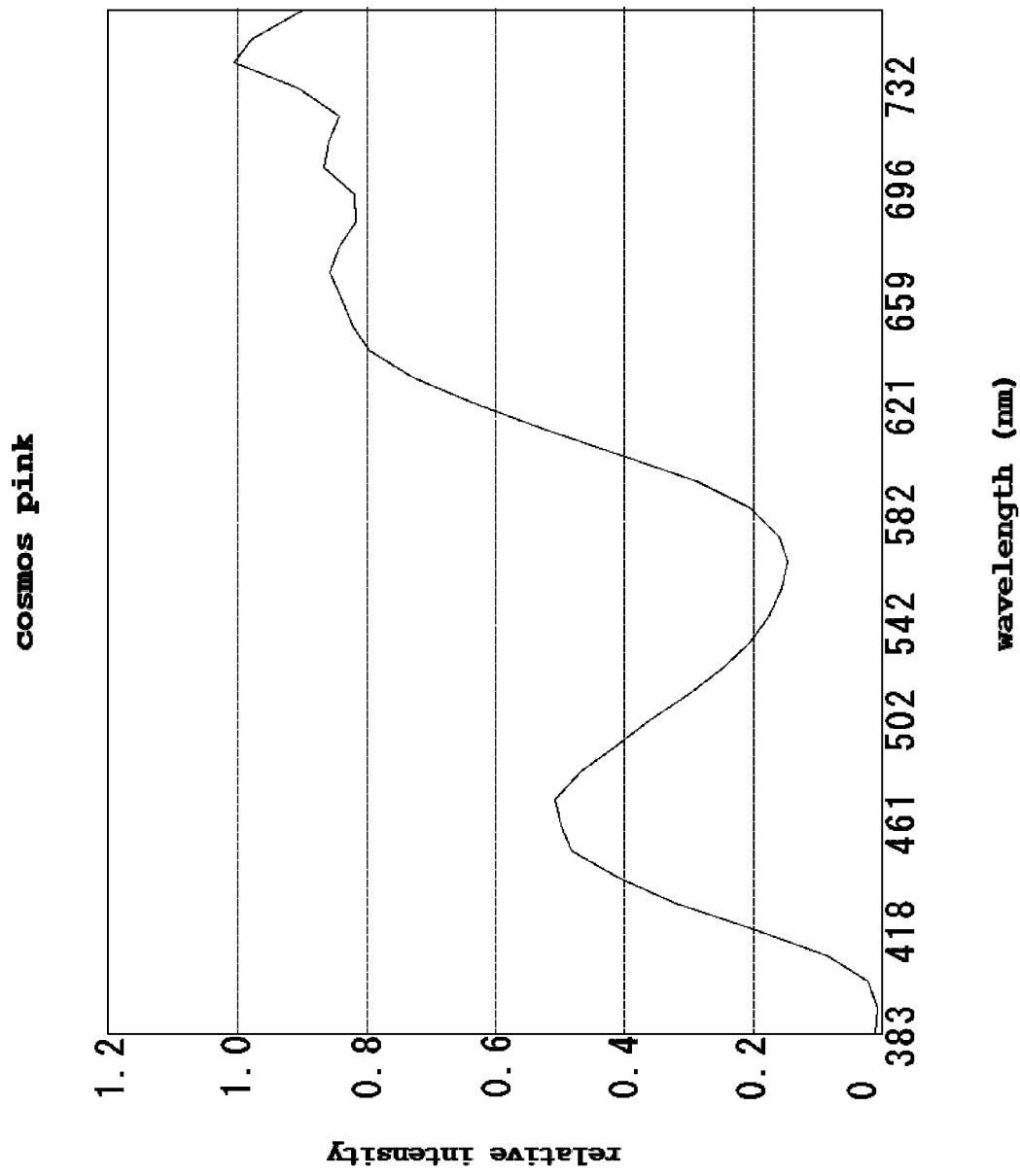
FIG. 15 is a reflection spectrum of pink cosmos petals for natural light.
Figure 18:
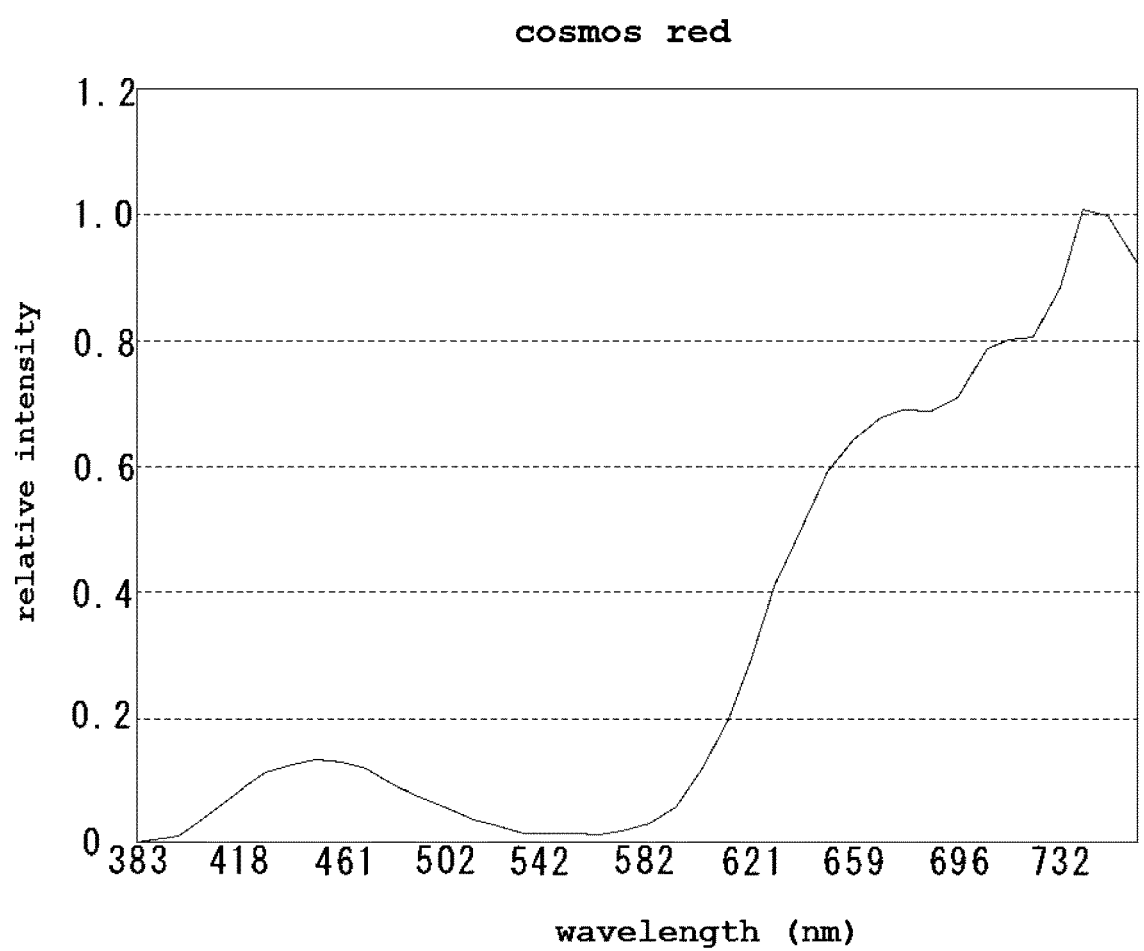
FIG. 18 shows a reflection spectrum of red cosmos petals for natural light.
Figure 21:
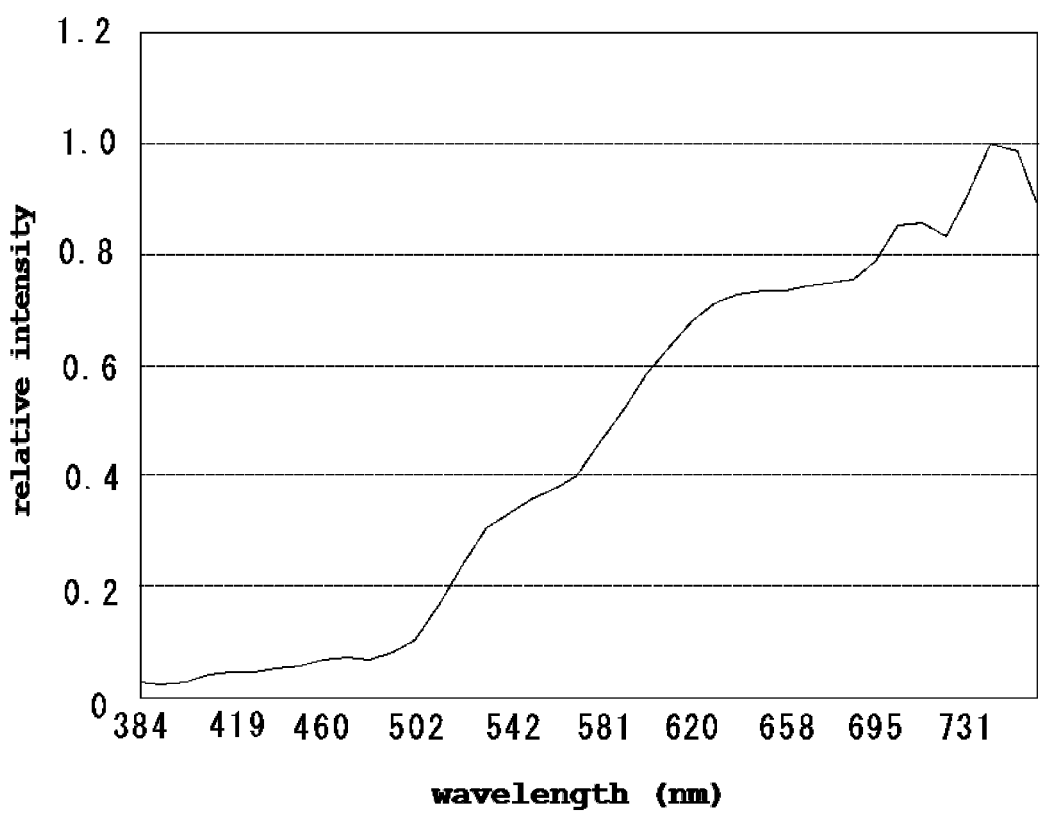
FIG. 21 shows a reflection spectrum of red autumn leaves for natural light.
Figure 24:
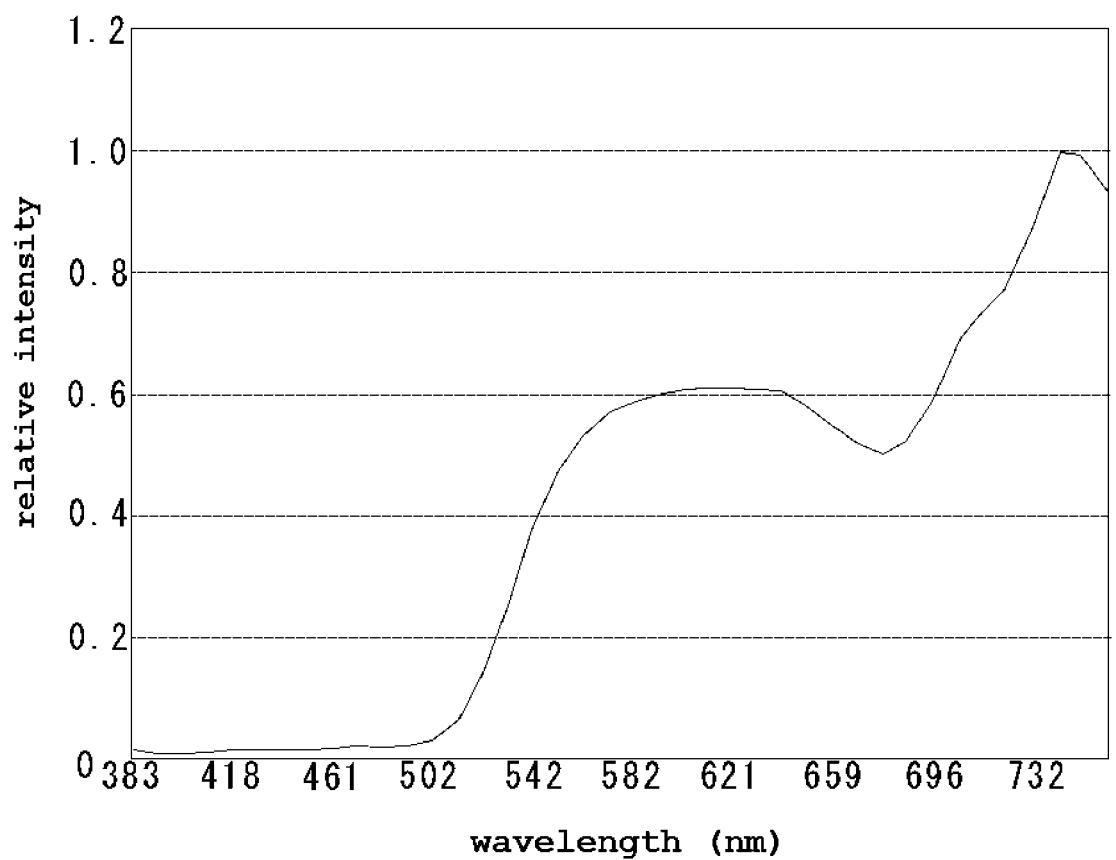
FIG. 24 shows a reflection spectrum of yellow sunflowers for natural light.
Figure 26:
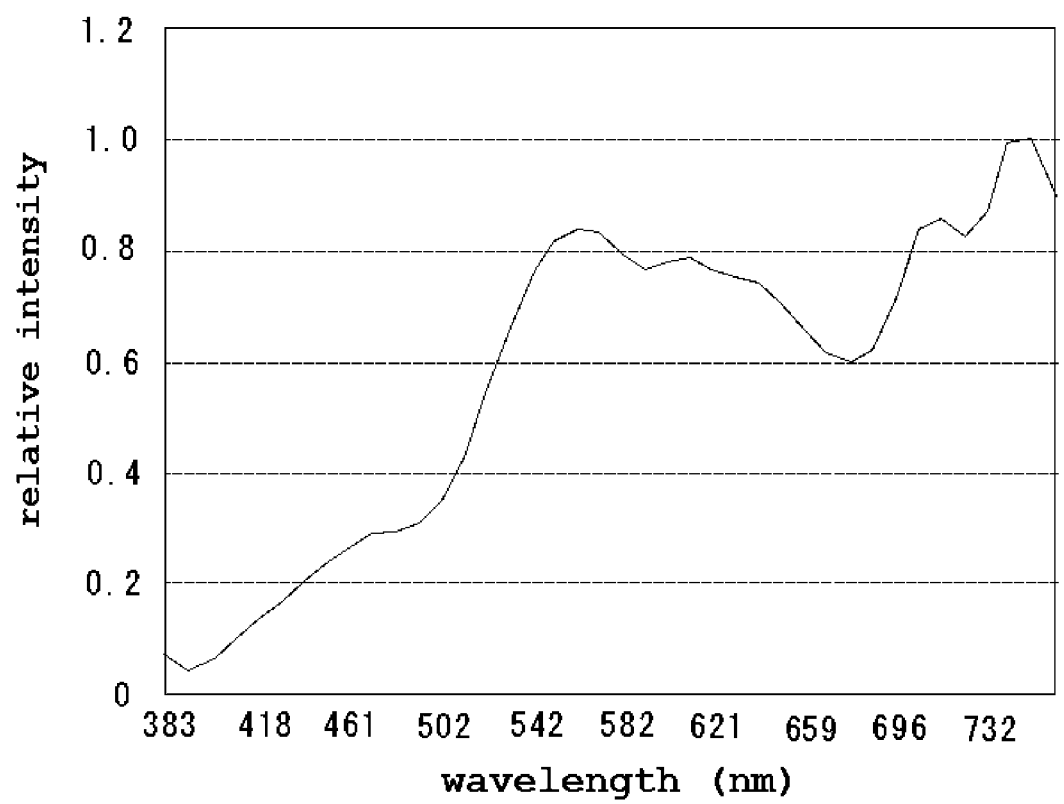
FIG. 26 shows a reflection spectrum of yellow ears of rice plants for natural light.

For example, examples of the reflection spectra that constitute the respective white colors of the white moon having chromaticity coordinates (X, Y) of (0.368, 0.371) in the XYZ colorimetric system, a white lake surface having the chromaticity coordinates (0.313, 0.366), and white cosmos petals having the chromaticity coordinates (0.342, 0.362) are shown in FIGS. 3, 6, and 9, respectively. Examples of the reflection spectra that constitute the pink colors of pink (cherry blossom pink color) cherry blossom petals having the chromaticity coordinates (0.368, 0.321), and pink cosmos petals having the chromaticity coordinates (0.366, 0.263) are shown in FIGS. 12 and 15, respectively. An example of the reflection spectrum that constitutes red cosmos petals having the chromaticity coordinates (0.440, 0.226) is shown in FIG. 18. Examples of the reflection spectra that constitute red autumn leaves having the chromaticity coordinates (0.494, 0.323), and the respective yellow colors of yellow sunflower petals having the chromaticity coordinates (0.521, 0.461) and yellow ears of rice plants having the chromaticity coordinates (0.421, 0.432) are shown in FIGS. 21, 24, and 26, respectively.

For example, a comparison of the spectra of the white moon in FIG. 3, the white lake surface in FIG. 6, and the white cosmos in FIG. 9 shows that the spectra that constitute the respective colors are significantly different even though they are all in the white region on the chromaticity coordinates in the XYZ colorimetric system. The same applies to the pink region for the pink cherry blossom petals in FIG. 12 and the pink cosmos petals in FIG. 15. The same applies to the yellow region for the sunflower petals in FIG. 24 and the ears of rice plants in FIG. 26. With the method for manufacturing a lighting device according to the present embodiment, color matching is performed, not based on the chromaticity coordinates in the XYZ colorimetric system, but through acquisition of a spectrum. Accordingly, it is possible to manufacture a lighting device whose color of light resembles the color of a measurement target in spectrum as well.

Figure 30:
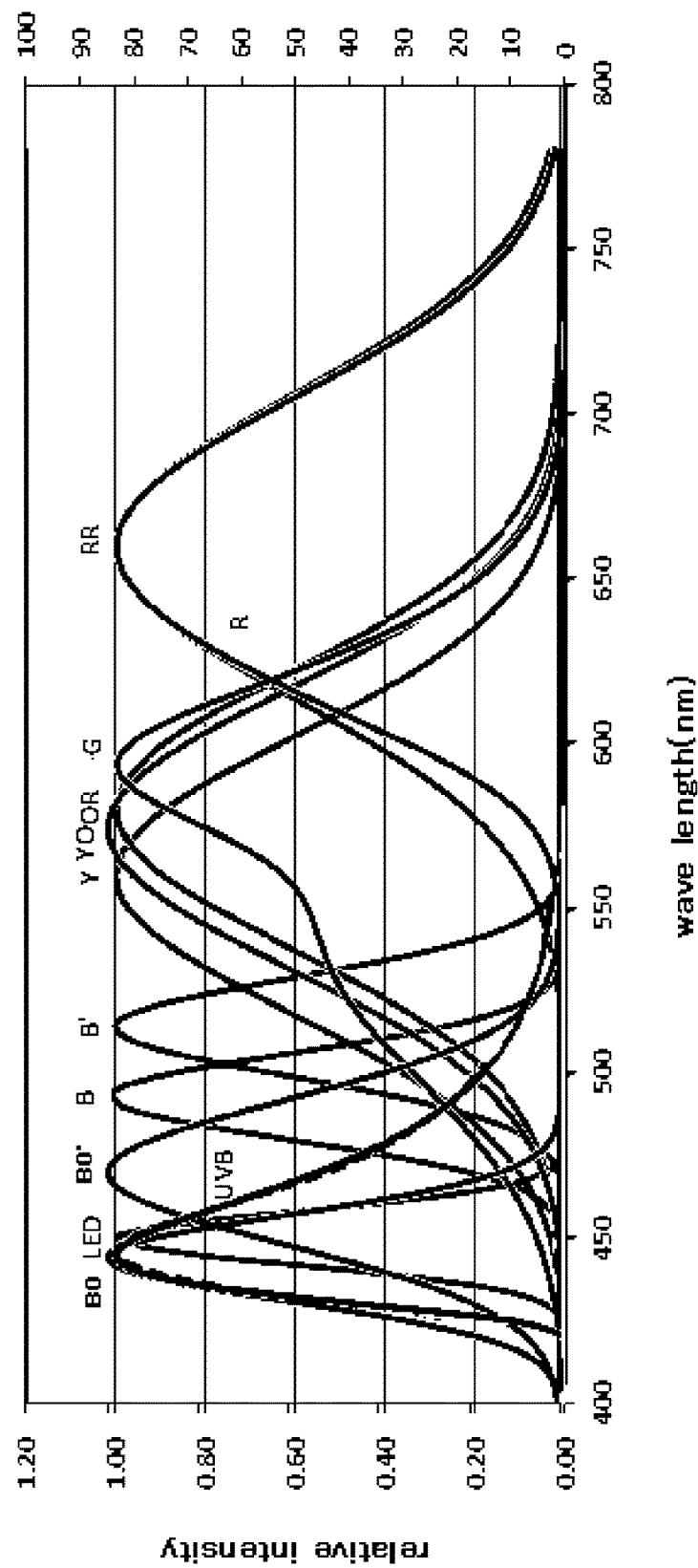
FIG. 30 shows fluorescence spectra of various fluorescent substances and an emission spectrum of blue light of a blue LED element used in the examples.

FIG. 30 shows representative examples of the fluorescence spectra of various fluorescent substances and the emission spectrum of the blue light of a blue LED element used in the examples described below. LED indicates the emission spectrum of the blue LED element, UVB indicates the fluorescence spectrum of a blue fluorescent substance UVB that can be excited by UV, B indicates the fluorescence spectrum of a blue-green fluorescent substance B, B' indicates the fluorescence spectrum of a green fluorescent substance B', Y indicates the fluorescence spectrum of a yellow fluorescent substance Y, YO indicates the fluorescence spectrum of a yellow fluorescent substance YO, OR indicates the fluorescence spectrum of an orange fluorescent substance OR, G indicates the fluorescence spectrum of an orange fluorescent substance G, R indicates the fluorescence spectrum of a red fluorescent substance R, and RR indicates the fluorescence spectrum of a red fluorescent substance RR.

By mixing lights so as to form the intended spectrum by combining the emission caused by the blue LED element, the fluorescence caused by the fluorescent substances of the respective colors, and the diffused light generated by the coloring pigment as shown in FIG. 30, light of a color resembling the color of the measurement target is generated as a composite spectrum resulting from mixing the colors of these lights, as will be described in the examples below.

Figure 31:
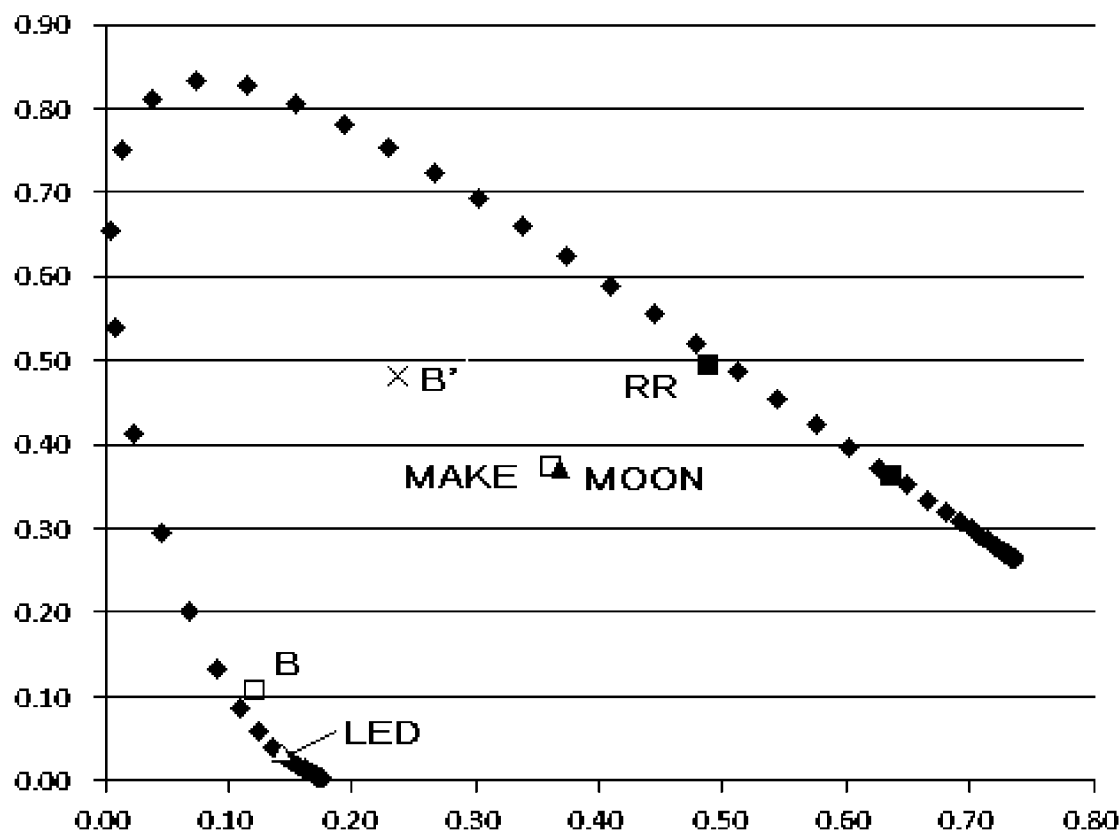
FIG. 31 shows coordinates of white LED devices produced in Example 1, a blue LED element, and fluorescent substances according to the XY chromaticity coordinates in the CIE colorimetric system.

FIG. 31 shows the XY chromaticity coordinates in the CIE colorimetric system of mixed-colored light emitted from a white LED device obtained using a blue LED device obtained in Example 1 described below. In FIG. 31, "MOON" indicates the emission chromaticity coordinates (0.368, 0.371) of the moon. B indicates the fluorescence chromaticity coordinates (0.122, 0.104) of the blue-green fluorescent substance B, B' indicates the fluorescence chromaticity coordinates (0.237, 0.480) of the green fluorescent substance B', RR indicates the fluorescence chromaticity coordinates (0.637, 0.361) of the red fluorescent substance RR, and "LED" indicates the emission chromaticity coordinates (0.143, 0.033) of the blue LED element. "MAKE" indicates the emission chromaticity coordinates (0.363, 0.371) of a white LED device, resulting from reproducing the color of moonlight by mixing the emission caused by the blue LED element, the emission caused by the fluorescent substances of the respective colors, and a yellow pigment Y.

Figure 5:
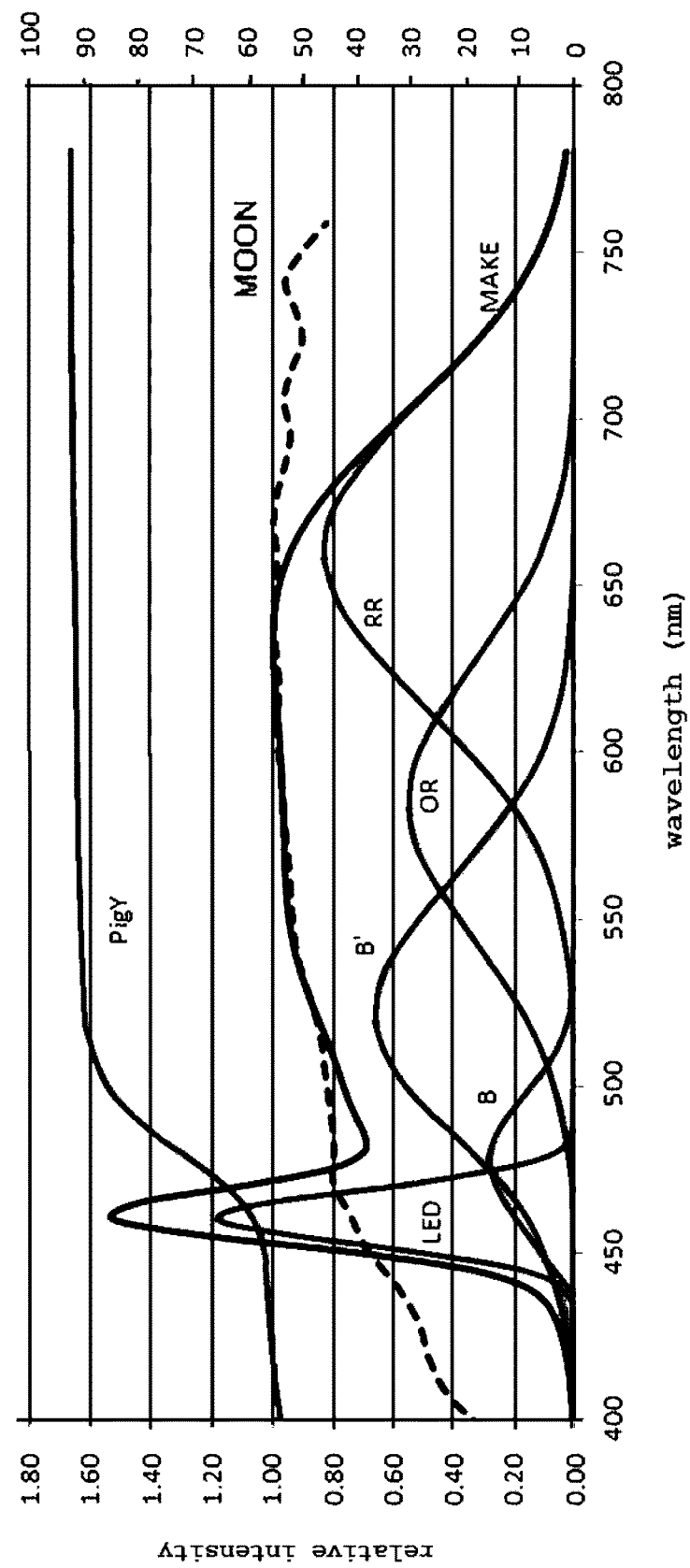
FIG. 5 shows an emission spectrum of an LED device, obtained by reproducing a reflection spectrum of white moonlight using a blue LED element.

As shown in FIG. 5, in the example of the white LED device obtained using the blue LED device obtained in Example 1 described below, the intensities of the lights that form the respective colors are adjusted such that the lights respectively emitted by the blue-green fluorescent substance B, the green fluorescent substance B', the orange fluorescent substance OR, the red fluorescent substance RR, the yellow pigment PIG Y, and the light-emitting LED of the blue LED element exhibit the spectra shown in FIG. 5 in order to reproduce the color represented by the emission chromaticity coordinates (0.368, 0.371) of the moon.

The following is a description of a method for manufacturing an LED device having a color resembling the color of a measurement target, based on the spectra obtained in the above-described manner.

In the manufacturing method of the LED device having a color resembling the color of a measurement target, the color of the measurement target is spectroscopically analyzed as described above, and a light-emitting element such as an LED, fluorescent substances, a coloring pigment, a color filter, and the like for forming an emission color are combined in order to adjust the color of the LED device to approximate the spectrum of the color of the measurement target.

As the LED element, it is preferable to use, for example, a blue LED element having an emission wavelength peak in the range of 420 to 490 nm, and an ultraviolet LED element or a near-ultraviolet LED element having an emission wavelength peak in the range of 380 to 420 nm. Specific examples of the LED element include a GaN-based LED, a SiC-based LED, a ZnSe-based LED, and an InGaN-based LED.

The fluorescent substances are not particularly limited as long as a color resembling the color of the measurement target can be reproduced. Specific examples of the blue fluorescent substance include a blue fluorescent substance, a blue-green fluorescent substance that can be excited by ultraviolet light or near-ultraviolet light, and that have a fluorescent wavelength peak in the blue range of 400 nm to 495 nm, preferably 430 to 480 nm, and a green fluorescent substance. Examples of the green fluorescent substance include a green fluorescent substance that can be excited by blue light of a blue LED element, or ultraviolet light or near-ultraviolet light of an ultraviolet LED element or a near-ultraviolet LED element, and that emits green light having a fluorescent wavelength in the range of 495 nm to 530 nm, preferably 495 nm to 525 nm. Specific examples of such a green fluorescent substance include a silicate-based green fluorescent substance, an aluminate-based green fluorescent substance, and a SiAlON-based green fluorescent substance such as β-SiAlON:Eu. Examples of the red fluorescent substance include a red fluorescent substance emitting red light and an orange fluorescent substance emitting orange light that can be excited by the light from the LED element or the emission caused by another fluorescent substance, and that have a fluorescent wavelength in the range of 595 nm to 680 nm, preferably 600 nm to 650 nm. Specific examples of the red fluorescent substance and the orange fluorescent substance include a nitride-based red fluorescent substance, a silicate-based red fluorescent substance, a CASN-based red fluorescent substance such as CaAlSiN$_3$:Eu, and a SiAlON-based red fluorescent substance. Examples of the yellow fluorescent substance include a YAG-based fluorescent substance that emits excitation light having an emission peak at a wavelength of 550 nm to 590 nm.

Figure 29:
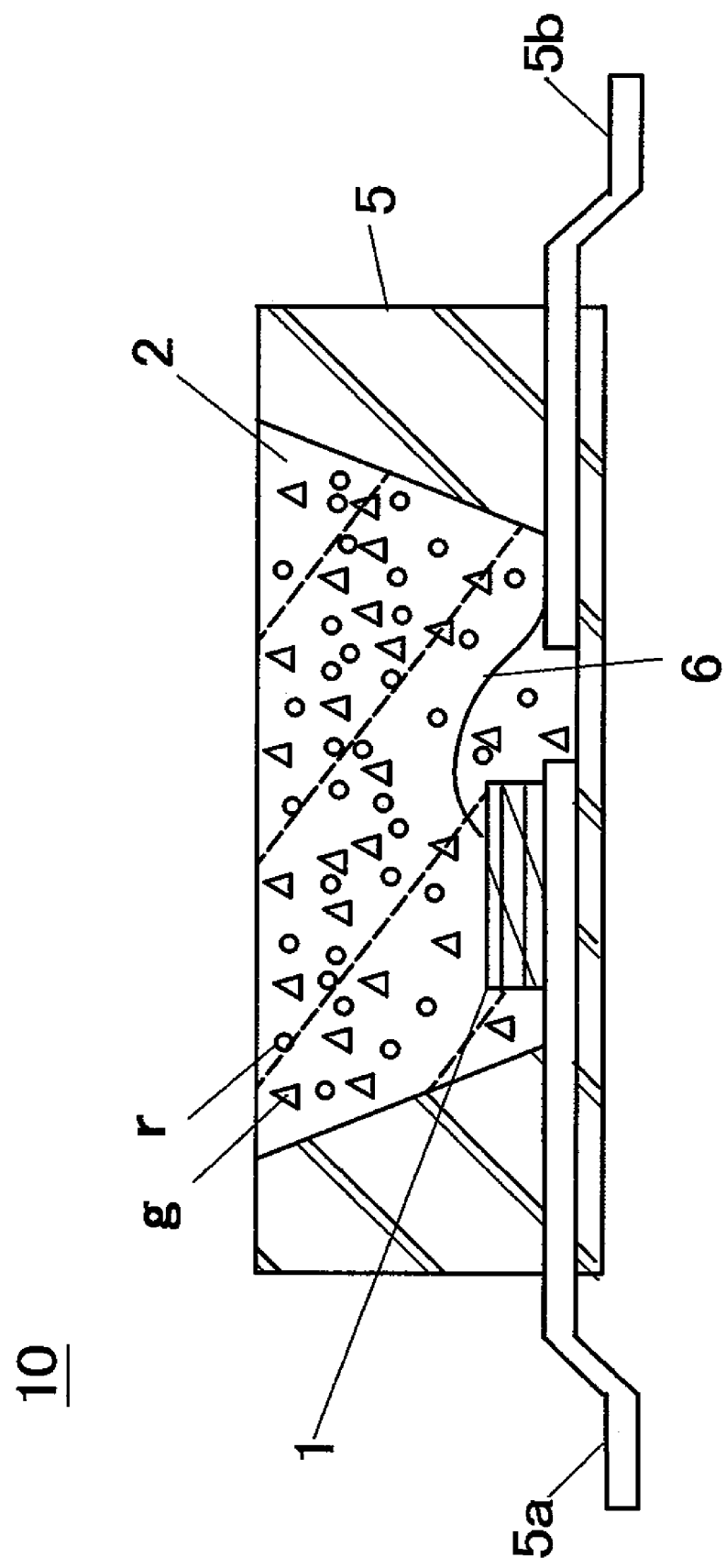
FIG. 29 is a schematic cross-sectional view of an LED device 10 of an embodiment according to the present invention.

FIG. 29 is a schematic cross-sectional view schematically showing an LED device 10 whose emission color has been adjusted, according to an embodiment of the present invention. The LED device 10 includes a light-emitting substance housing member 5 having an upwardly open recess and in which a pair of leads 5a and 5b extending to the outside are disposed, and an LED element 1, and the recess portion that houses the LED element 1 is sealed with a resin sealing body 2 containing a fluorescent substance r and a fluorescent substance g. One electrode of the LED element 1 is connected to the lead 5a, and the other electrode of the LED element 1 is connected to the lead 5b by being wire-bonded using a gold wire 6.

The LED element 1 emits, for example, blue light having an emission spectrum with an emission wavelength peak in the blue region of 420 nm to 490 nm, or ultraviolet light or near-ultraviolet light of 380 to 420 nm. The fluorescent substance g is excited by the blue light, ultraviolet light or near-ultraviolet light from the LED element 1, and emits blue light or green light having a spectrum with a fluorescent wavelength peak in the blue region of 400 nm to 495 nm or the green region of 495 nm to 530 nm. The fluorescent substance r is excited by the emission of the LED element 1, and emits red light having a spectrum with a fluorescent wavelength peak in the red region of 595 nm to 680 nm. Additionally, a fluorescent substance that emits another color is contained as needed. By adjusting the intensities of the respective light colors, the light of a LED device 10 can be approximated to the spectrum of the color of the measurement target, which has been spectroscopically analyzed in the above-described manner.

Figure 32:
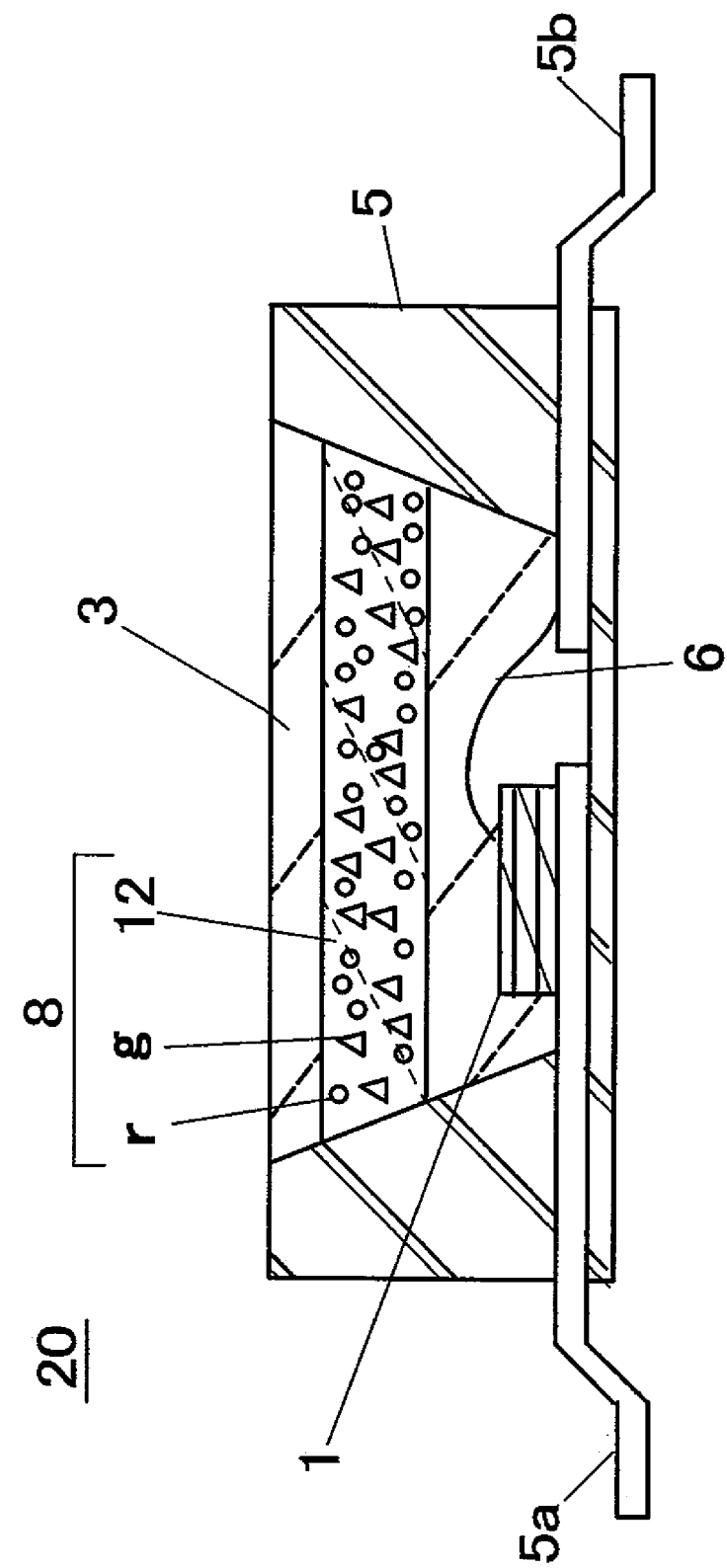
FIG. 32 is a schematic cross-sectional view of an LED device 20 of an embodiment according to the present invention.

The configuration of the LED device is not particularly limited. Specifically, examples of other configurations include an LED device 20, as shown in FIG. 32, that can be obtained by placing a fluorescent substance sheet and sealing the sheet. FIG. 32 is a schematic cross-sectional view of the LED device 20 in which a fluorescent substance-containing sheet 8 obtained by dispersing the fluorescent substance g and the fluorescent substance r in a resin 12 such as a silicone resin or a silicone rubber and molding the resin 12 in the form of a sheet is disposed in a sealing resin 3 for sealing the LED element 1. In the LED device 20, the emission of the LED element 1 excites the fluorescent substance g and the fluorescent substance r contained in the fluorescent substance-containing sheet 8 so as to emit fluorescence, thus achieving wavelength conversion.

EXAMPLES

Hereinafter, the present invention will be described more specifically by way of examples. It should be appreciated that the scope of the present invention is by no means limited by the examples.

First, the LED devices, fluorescent substances, and colorants used in the examples will be described. Note that FIG. 30 collectively shows representative examples of the emission spectra LED of the LED devices and the fluorescence spectra of the fluorescent substances described below.

Near-ultraviolet LED device: a near-ultraviolet LED device that has a near-ultraviolet light spectrum in the wavelength range of 385 to 405 nm with a peak at 395 nm.

Blue LED device: a blue LED device that emits light of a color located at the chromaticity coordinates (0.143, 0.033), and emits blue light having an emission spectrum in the wavelength range of 435 to 480 nm with a wavelength peak at 460 nm.

Blue fluorescent substance UVB: a blue fluorescent substance (BSNA490) that emits blue light located at the chromaticity coordinates (0.151, 0.078), and has a fluorescence spectrum in the wavelength range of 400 to 600 nm with a peak at 445 nm.

Blue fluorescent substance B0: a silicate-based blue fluorescent substance that emits blue light located at the chromaticity-coordinates (0.158, 0.017), and has a fluorescence spectrum in the wavelength range of 400 to 585 nm with a peak at 444 nm.

Blue fluorescent substance B0': a silicate-based green fluorescent substance that emits blue light located at the chromaticity coordinates (0.127, 0.094), and has a fluorescence spectrum in the wavelength range of 400 to 540 nm with a peak at 470 nm.

Blue fluorescent substance B2: a silicate-based green fluorescent substance that emits blue light located at the chromaticity coordinates (0.127, 0.094), and has a fluorescence spectrum in the wavelength range of 400 to 550 nm with a peak at 470 nm.

Blue fluorescent substance B1: a silicate-based green fluorescent substance that emits blue light located at the chromaticity coordinates (0.112, 0.164), and has a fluorescence spectrum in the wavelength range of 400 to 530 nm with a peak at 480 nm.

Blue-green fluorescent substance B: a silicate-based blue-green fluorescent substance that emits blue-green light located at the chromaticity coordinates (0.122, 0.104), and has a fluorescence spectrum in the wavelength range of 460 to 530 nm with a peak at 493 nm.

Green fluorescent substance BG: a silicate-based green fluorescent substance that emits green light located at the chromaticity coordinates (0.215, 0.412), and has a fluorescence spectrum in the wavelength range of 390 to 640 nm with a peak at 510 nm.

Green fluorescent substance B': a silicate-based green fluorescent substance that emits green light located at the chromaticity coordinates (0.237, 0.480), and has a fluorescence spectrum in the wavelength range of 380 to 630 nm with a peak at 514 nm.

Yellow fluorescent substance Y: a YAG-based yellow fluorescent substance that emits yellow light located at the chromaticity coordinates (0.400, 0.538), and has a fluorescence spectrum in the wavelength range of 430 to 680 nm with a peak at 550 nm.

Yellow fluorescent substance YO: a YAG-based yellow fluorescent substance that emits yellow light located at the chromaticity coordinates (0.456, 0.513), and has a fluorescence spectrum in the wavelength range of 460 to 700 nm with a peak at 575 nm.

Green fluorescent substance G: a nitride-based green fluorescent substance that emits green light located at the chromaticity coordinates (0.322, 0.516), and has a fluorescence spectrum in the wavelength range of 435 to 700 nm with a peak at 600 nm.

Yellow-green fluorescent substance O: a nitride-based green fluorescent substance that emits yellow-green light located at the chromaticity coordinates (0.473, 0.502), and has a fluorescence spectrum in the wavelength range of 450 to 700 nm with a peak at 580 nm.

Orange fluorescent substance OR: a nitride-based orange fluorescent substance that emits orange light located at the chromaticity coordinates (0.489, 0.492), and has a fluorescence spectrum in the wavelength range of 480 to 700 nm with a peak at 585 nm.

Red fluorescent substance R: a nitride-based red fluorescent substance that emits red light located at the chromaticity coordinates (0.623, 0.375), and has a fluorescence spectrum in the wavelength range of 550 to 780 nm with a peak at 650 nm.

Red fluorescent substance RR: a nitride-based red fluorescent substance that emits red light located at the chromaticity coordinates (0.637, 0.361), and has a fluorescence spectrum in the wavelength range of 520 to 780 nm with a peak at 660 nm.

Red fluorescent substance RRR: a nitride-based red fluorescent substance that emits red light located at the chromaticity coordinates (0.650, 0.349), and has a fluorescence spectrum in the wavelength range of 520 to 800 nm with a peak at 670 nm.

Yellow pigment PIG Y: bismuth vanadate yellow that absorbs a wavelength shorter than a wavelength near 550 nm Red pigment ES 1034: iron oxide red that absorbs a wavelength shorter than a wavelength near 500 nm Example 1

In each of the following examples, the reflection spectrum of the surface of each object for natural light and the chromaticity coordinates in the XYZ colorimetric system were measured using a color luminance meter (color luminance meter CS-200, manufactured by KONICA MINOLTA, INC.). In Example 1, in Shirakawa City of Fukushima Prefecture, the surface of a full moon in the sky at 21:30, Nov. 15, 2016 was spectroscopically measured. The obtained spectrum is shown in FIG. 3. As shown in FIG. 3, when the maximum reflectance at 668 nm was taken as a relative intensity of 1.0, the reflection spectrum of the surface of the moon for sunlight exhibited a relative intensity of 0.25 near 388 nm as the minimum reflectance, and exhibited a spectrum indicating peaks of a relative intensity of 0.80 near 471 nm and a relative intensity of 0.97 near 542 nm. The chromaticity coordinates (X, Y) in the XYZ colorimetric system were (0.368, 0.371), which represented white.

With reference to the measured spectrum, the color of the light of the near-ultraviolet LED device was adjusted to white light in the following manner. Specifically, a fluorescent substance sheet for being attached to the near-ultraviolet LED device and including a plurality of fluorescent substances and coloring pigments blended therein was prepared. The blue fluorescent substance UVB, the green fluorescent substance G, the yellow-green fluorescent substance O, and the red fluorescent substance RR were uniformly dispersed in a silicone rubber at a predetermined blending ratio, to produce a fluorescent substance sheet having a thickness of 0.5 mm. Note that the spectrum was measured using an integrating sphere MCPD 7000, manufactured by Otsuka Electronics Co., Ltd.

In addition, the color of the light of the blue LED device was adjusted to white in the same manner. Specifically, a fluorescent substance sheet for being attached to the blue LED device and including a plurality of fluorescent substances blended therein was prepared. The blue-green fluorescent substance B, the green fluorescent substance B', the orange fluorescent substance OR, the red fluorescent substance RR, and the yellow pigment PIG Y were uniformly dispersed in a silicone rubber at a predetermined blending ratio, to produce a fluorescent substance sheet having a thickness of 0.5 mm.

Figure 4:
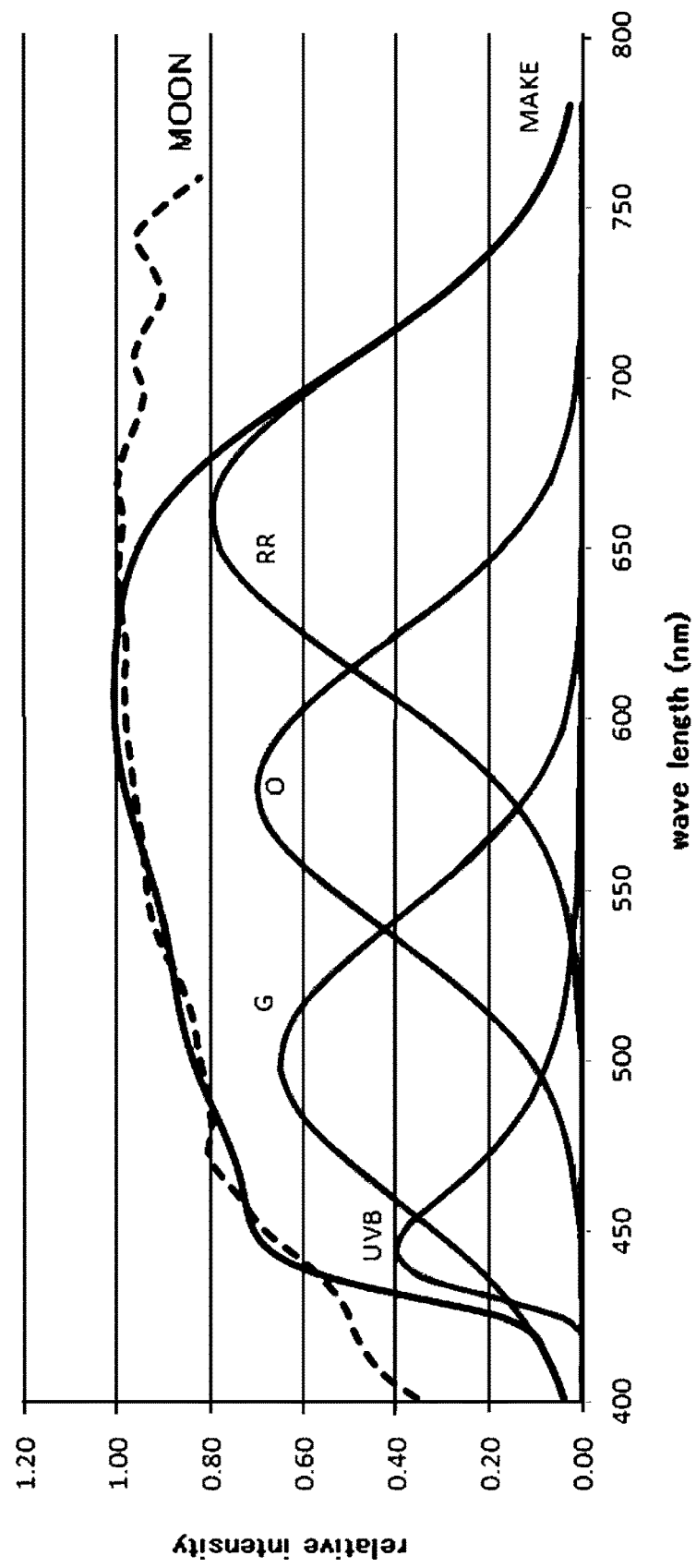
FIG. 4 shows an emission spectrum of an LED device, obtained by reproducing a reflection spectrum of white moonlight using a near-ultraviolet LED element.

Then, the fluorescent substance sheets were bonded to the respective LED devices, to obtain white LED devices. Spectroscopic measurement for obtaining the emission spectra of the obtained white LED devices was performed. The emission spectrum of the white LED device obtained using the near-ultraviolet LED device is shown in FIG. 4. The emission spectrum of the white LED device obtained using the blue LED device is shown in FIG. 5.

In FIGS. 4 and 5, "MAKE" indicates composite spectra indicating the emission of the obtained white LED devices. "LED" indicates the emission spectrum of the blue LED device. Note that the spectrum of the near-ultraviolet LED is not shown because it is outside the visible light range. The reference characters indicate the fluorescence spectra of the respective fluorescent substances. "PIG Y" indicates the spectral transmittance of the yellow pigment PIG Y. "MOON" in FIGS. 4 and 5 indicates the reflection spectrum of the moonlight shown in FIG. 3. As shown in FIG. 4, the emission spectrum of the white LED device obtained using the near-ultraviolet LED device exhibited a composite spectrum closely resembling the spectrum of the moon shown in FIG. 3. As shown in FIG. 5, the emission spectrum of the white LED device obtained using the blue LED device, on the whole, also exhibited a composite spectrum resembling the reflection spectrum of the moon shown in FIG. 3, although the blue light region was separated.

FIG. 31 shows the XY chromaticity coordinates in the CIE colorimetric system of the mixed-colored light emitted from the white LED device obtained using the blue LED device obtained in Example 1. In FIG. 31, "MOON" indicates the emission chromaticity coordinates (0.368, 0.371) of the moon. B indicates the fluorescence chromaticity coordinates (0.122, 0.104) of the blue-green fluorescent substance, B' indicates the fluorescence chromaticity coordinates (0.237, 0.480) of the green fluorescent substance, RR indicates the fluorescence chromaticity coordinates (0.637, 0.361) of the red fluorescent substance, and "LED" indicates the emission chromaticity coordinates (0.143, 0.033) of the blue LED element. "MAKE" indicates the emission chromaticity coordinates (0.363, 0.371) of the white LED device, resulting from reproducing the color of the moonlight by combining the emission of the blue LED element, the emission of the fluorescent substances of the respective colors, and the yellow pigment Y. The chromaticity coordinates (X, Y) in the XYZ colorimetric system were (0.363, 0.371), which represented white, and were similar to those of the moonlight.

Example 2

At Five Colour Ponds in Yama District of Fukushima Prefecture, the water surface was spectroscopically measured in the same manner as in Example 1. The obtained reflection spectrum is shown in FIG. 6. As shown in FIG. 6, when the maximum reflectance at 738 nm was taken as a relative intensity of 1.0, the reflection spectrum of the water surface exhibited a relative intensity of 0.31 near 389 nm as the minimum reflectance, and exhibited a spectrum indicating peaks of a relative intensity of 0.65 near 471 nm, a relative intensity of 0.75 near 542 nm, and a relative intensity of 0.38 near 695 nm. The chromaticity coordinates (X, Y) in the XYZ colorimetric system were near (0.313, 0.366), which represented white.

With reference to the measured reflection spectrum, the color of the light of the near-ultraviolet LED device was adjusted to white in the following manner. Specifically, a fluorescent substance sheet for being attached to the near-ultraviolet LED device and including a plurality of fluorescent substances blended therein was prepared. The blue fluorescent substance UVB, the green fluorescent substance BG, the yellow fluorescent substance Y, and the red fluorescent substance R were uniformly dispersed in a silicone rubber at a predetermined blending ratio, to produce a fluorescent substance sheet having a thickness of 0.5 mm.

In addition, the color of the light of the blue LED device was adjusted to white in the same manner. Specifically, a fluorescent substance sheet for being attached to the blue LED device and including a plurality of fluorescent substances blended therein was prepared. The blue-green fluorescent substance B, the green fluorescent substance B', the yellow fluorescent substance YO, and the red fluorescent substance RR were uniformly dispersed in a silicone rubber at a predetermined blending ratio, to produce a fluorescent substance sheet having a thickness of 0.5 mm.

Figure 7:
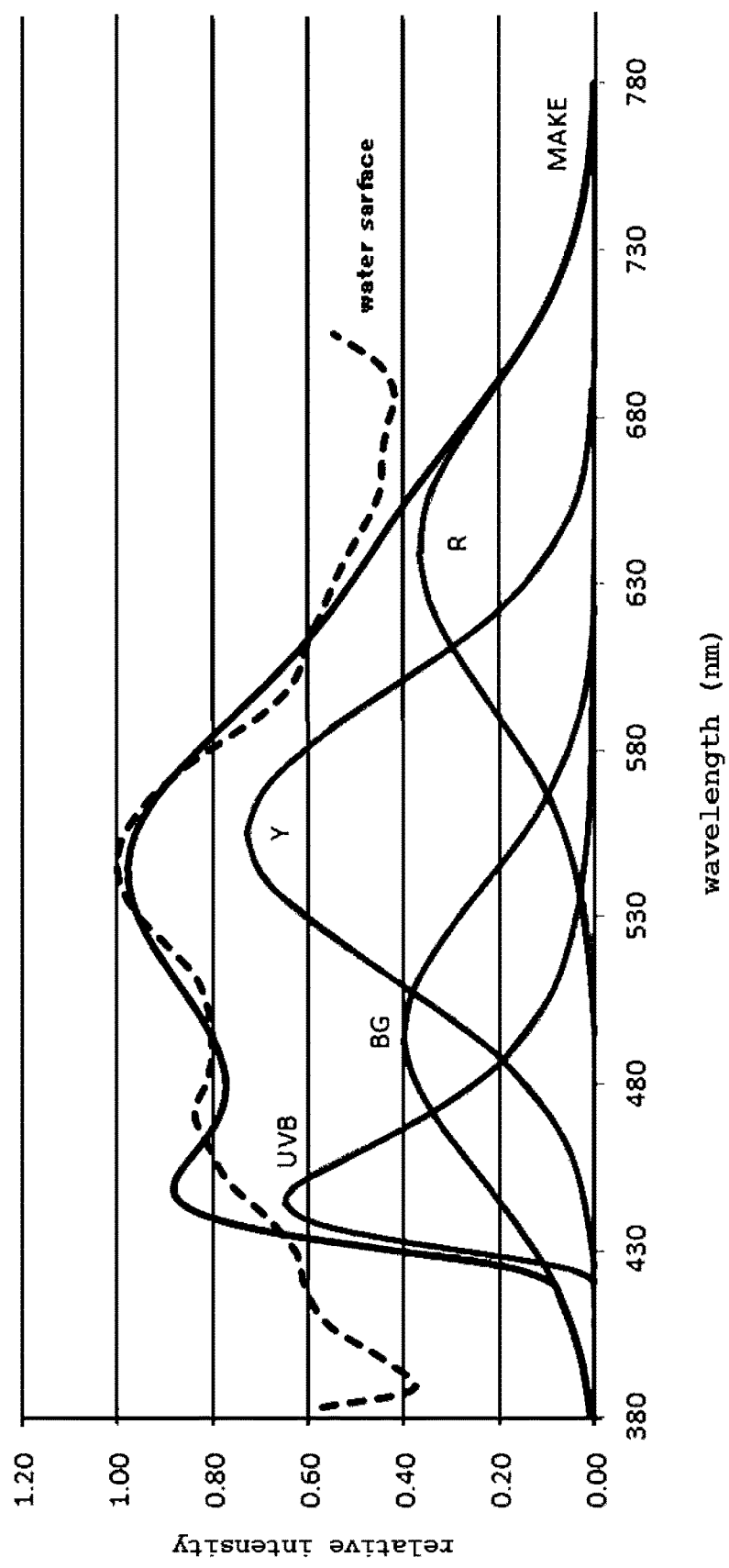
FIG. 7 shows an emission spectrum of an LED device, obtained by reproducing a reflection spectrum of a white lake surface using an ultraviolet LED element.

Then, the fluorescent substance sheets were bonded to the respective LED devices, to obtain white LED devices. Spectroscopic measurement for obtaining the emission spectra of the obtained white LED devices was performed. The emission spectrum of the white LED device obtained using the near-ultraviolet LED device is shown in FIG. 7. The emission spectrum of the white LED device obtained using the blue LED device is shown in FIG. 8.

Figure 8:
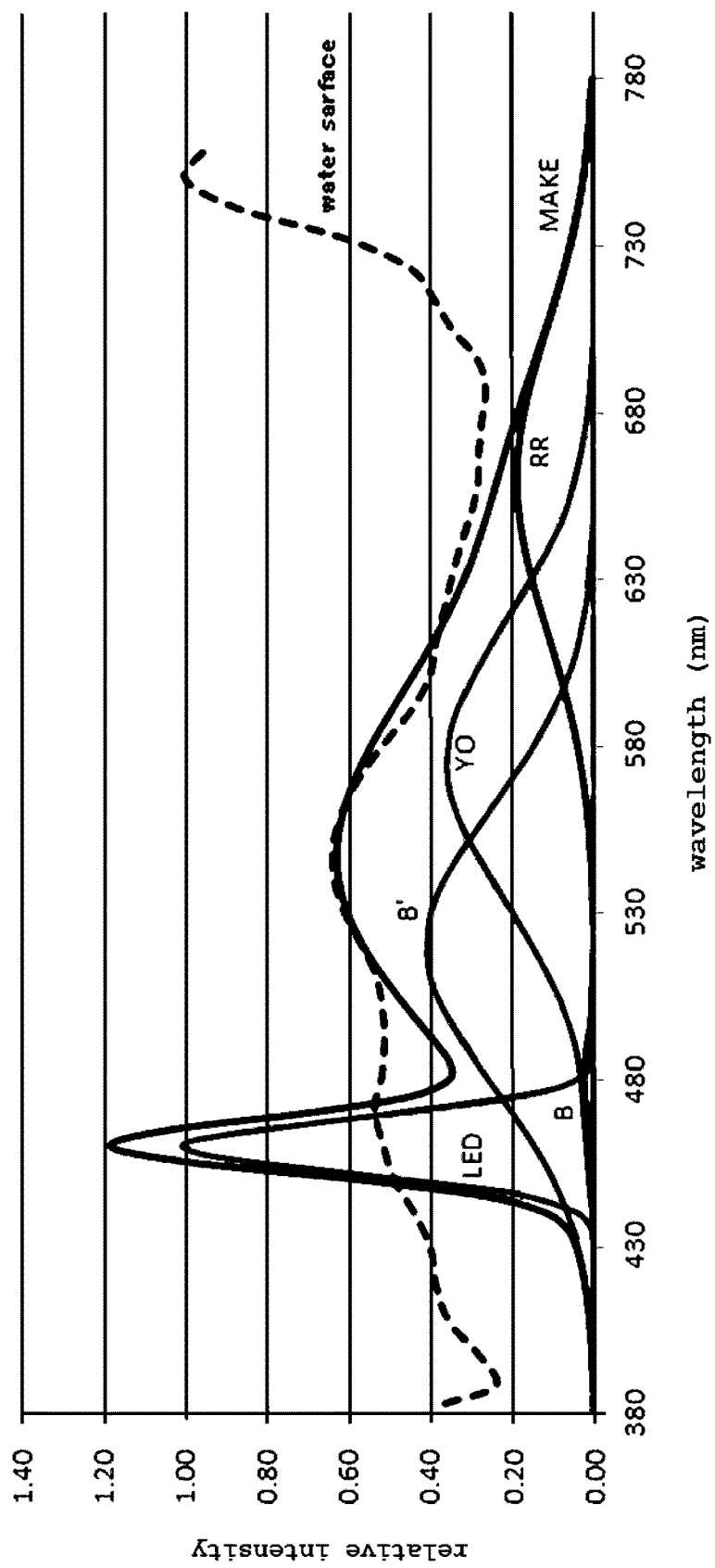
FIG. 8 shows an emission spectrum of an LED device, obtained by reproducing a reflection spectrum of a white lake surface using a blue LED element.

In FIGS. 7 and 8, "MAKE" indicates composite spectra indicating the emission of the obtained white LED devices. "LED" indicates the emission spectrum of the blue LED device, and the reference characters indicate the fluorescence spectra of the respective fluorescent substances. In FIGS. 7 and 8, "water surface" indicates the reflection spectrum of the water surface shown in FIG. 6. As shown in FIGS. 7 and 8, the emission spectra of the obtained white LED devices exhibited a composite spectrum resembling the spectrum of the water surface shown in FIG. 6. The chromaticity coordinates (X, Y) in the XYZ colorimetric system were near (0.314, 0.366), which represented white, and were similar to those of the white water surface.

Example 3

The surface of white cosmos petals was spectroscopically measured in the same manner as in Example 1. The obtained reflection spectrum is shown in FIG. 9. As shown in FIG. 9, when the maximum reflectance at 473 nm was taken as a relative intensity of 1.0, the reflection spectrum of the surface of the white cosmos petals for sunlight exhibited a relative intensity of 0.25 near 388 nm as the minimum reflectance, and exhibited a spectrum indicating peaks of a relative intensity of 0.80 near 471 nm and a relative intensity of 0.97 near 542 nm. The chromaticity coordinates (X, Y) in the XYZ colorimetric system were (0.342 0.362), which represented white.

With reference to the measured reflection spectrum, the color of the light of the near-ultraviolet LED device was adjusted to white in the following manner. Specifically, a fluorescent substance sheet for being attached to the near-ultraviolet LED device and including a plurality of fluorescent substances blended therein was prepared. The blue fluorescent substance UVB, the green fluorescent substance BG, the yellow fluorescent substance Y, and the red fluorescent substance RR were uniformly dispersed in a silicone rubber at a predetermined blending ratio, to produce a fluorescent substance sheet having a thickness of 0.5 mm.

In addition, the color of the light of the blue LED device was adjusted to white in the same manner. Specifically, a fluorescent substance sheet for being attached to the blue LED device and including a plurality of fluorescent substances blended therein was prepared. The blue-green fluorescent substance B, the green fluorescent substance B', the yellow fluorescent substance Y, and the red fluorescent substance RR were uniformly dispersed in a silicone rubber at a predetermined blending ratio, to produce a fluorescent substance sheet having a thickness of 0.5 mm.

Figure 10:
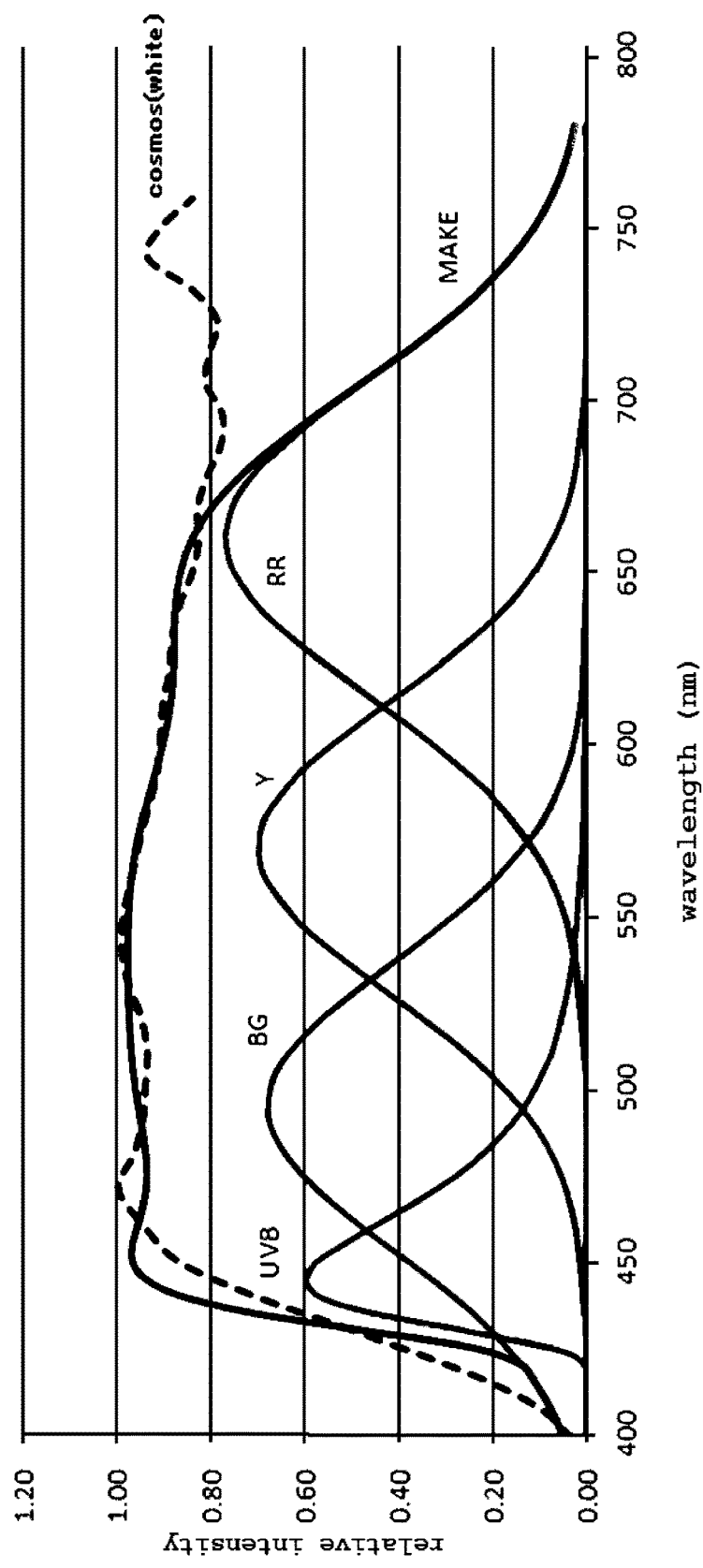
FIG. 10 shows an emission spectrum of an LED device, obtained by reproducing a reflection spectrum of a white cosmos using an ultraviolet LED element.

Then, the fluorescent substance sheets were bonded to the respective LED devices, to obtain white LED devices. Spectroscopic measurement for obtaining the emission spectra of the obtained white LED devices was performed. The emission spectrum of the white LED device obtained using the near-ultraviolet LED device is shown in FIG. 10. The emission spectrum of the white LED device obtained using the blue LED device is shown in FIG. 11.

Figure 11:
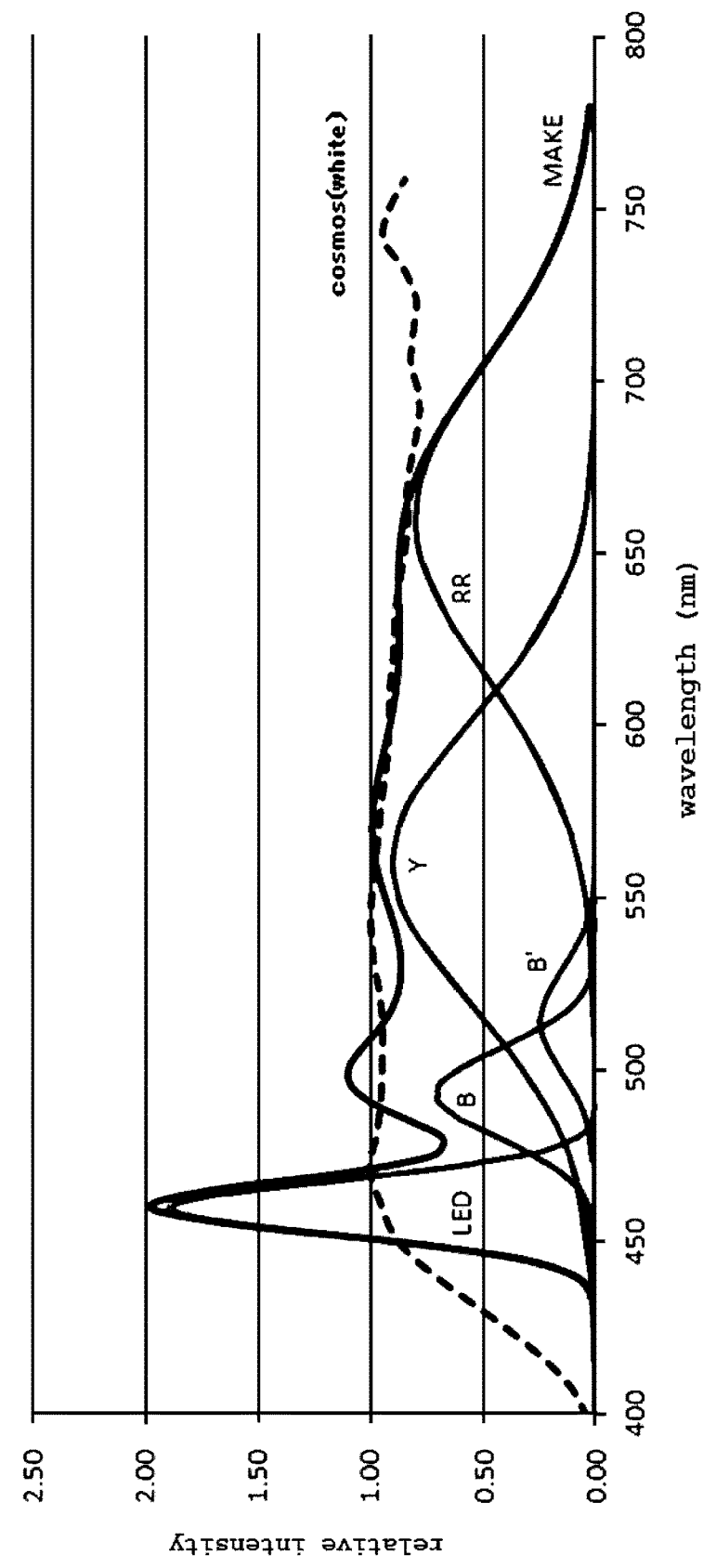
FIG. 11 shows an emission spectrum of an LED device, obtained by reproducing a reflection spectrum of a white cosmos using a blue LED element.

In FIGS. 10 and 11, "MAKE" indicates composite spectra indicating the emission of the obtained white LED devices. "LED" indicates the emission spectrum of the blue LED device, and the reference characters indicate the fluorescence spectra of the respective fluorescent substances. In FIGS. 10 and 11, "cosmos(white)" indicates the reflection spectrum of the surface of the cosmos petals shown in FIG. 9. As shown in FIGS. 10 and 11, the emission spectra of the obtained white LED devices exhibited a composite spectrum resembling the spectrum of the surface of the cosmos petals shown in FIG. 9. The chromaticity coordinates (X, Y) in the XYZ colorimetric system were near (0.341, 0.363), which represented white, and were similar to those of the surface of the cosmos petals.

Example 4

The surface of cherry blossom petals was spectroscopically measured in the same manner as in Example 1. The obtained reflection spectrum is shown in FIG. 12. As shown in FIG. 12, when the maximum reflectance at 738 nm was taken as a relative intensity of 1.0, the reflection spectrum of the surface of the cherry blossom pink cherry blossom petals exhibited a relative intensity of 0.01 near 384 nm as the minimum reflectance, and exhibited a spectrum indicating peaks of a relative intensity of 0.50 near 470 nm, a relative intensity of 0.40 near 530 nm, a relative intensity of 0.71 near 640 nm, and a relative intensity of 0.66 near 680 nm. The chromaticity coordinates (X, Y) in the XYZ colorimetric system were (0.368, 0.321), which represented cherry blossom pink.

With reference to the measured reflection spectrum, the color of the light of the near-ultraviolet LED device was adjusted to cherry blossom pink in the following manner. Specifically, a fluorescent substance sheet for being attached to the near-ultraviolet LED device and including a plurality of fluorescent substances blended therein was prepared. The blue fluorescent substance UVB, the green fluorescent substance BG, and the red fluorescent substance R were uniformly dispersed in a silicone rubber at a predetermined blending ratio, to produce a fluorescent substance sheet having a thickness of 0.5 mm.

In addition, the color of the light of the blue LED device was adjusted to cherry blossom pink in the same manner. Specifically, the blue-green fluorescent substance B, the green fluorescent substance B', the orange fluorescent substance G, the red fluorescent substance R, and a red pigment ES 1034 were uniformly dispersed in a silicone rubber at a predetermined blending ratio, to produce a fluorescent substance sheet having a thickness of 0.5 mm.

Figure 13:
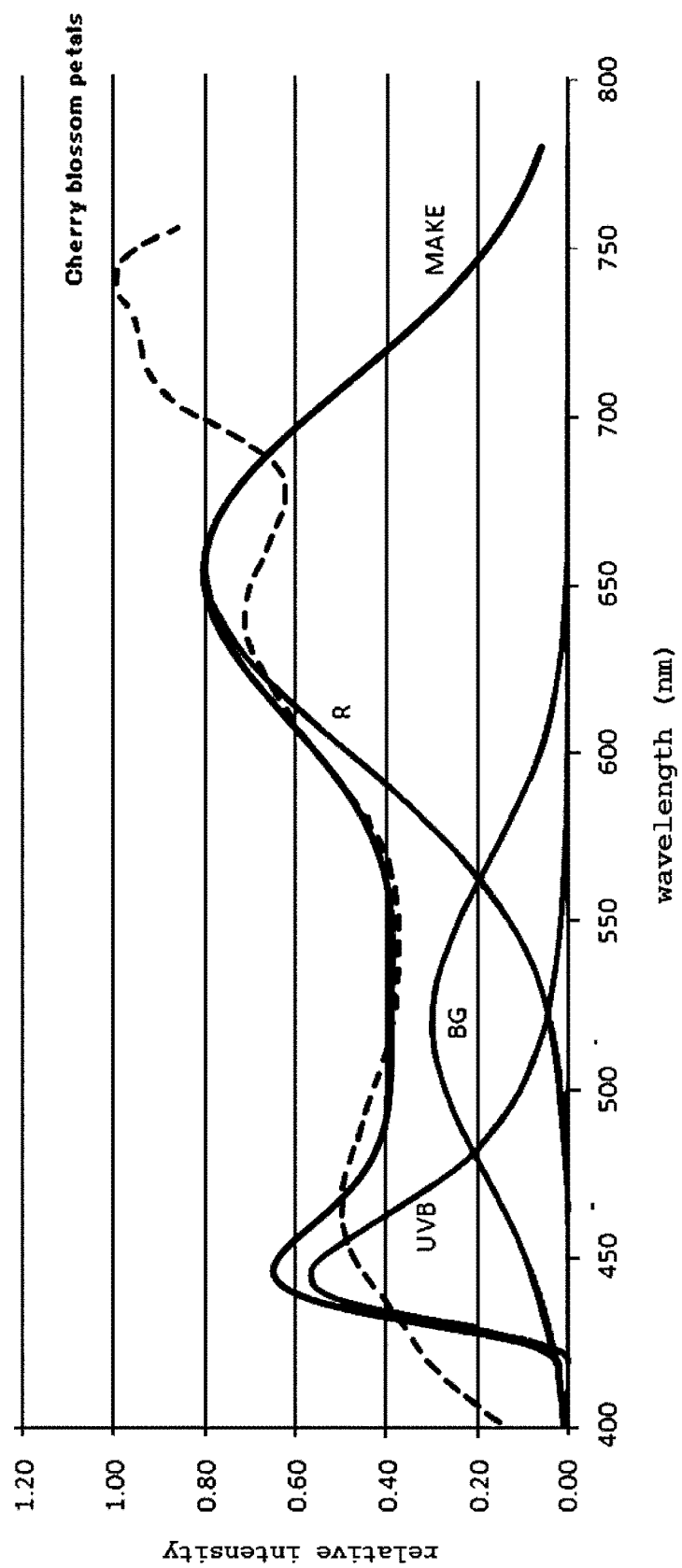
FIG. 13 shows an emission spectrum of an LED device, obtained by reproducing a reflection spectrum of pink (cherry blossom pink) cherry blossom petals using an ultraviolet LED element.

Then, the fluorescent substance sheets were bonded to the respective LED devices, to obtain cherry blossom pink color LED devices. Spectroscopic measurement for obtaining the emission spectra of the obtained cherry blossom pink color LED devices was performed. The emission spectrum of the cherry blossom pink color LED device obtained using the near-ultraviolet LED device is shown in FIG. 13. The emission spectrum of the cherry blossom pink color LED device obtained using the blue LED device is shown in FIG. 14.

Figure 14:
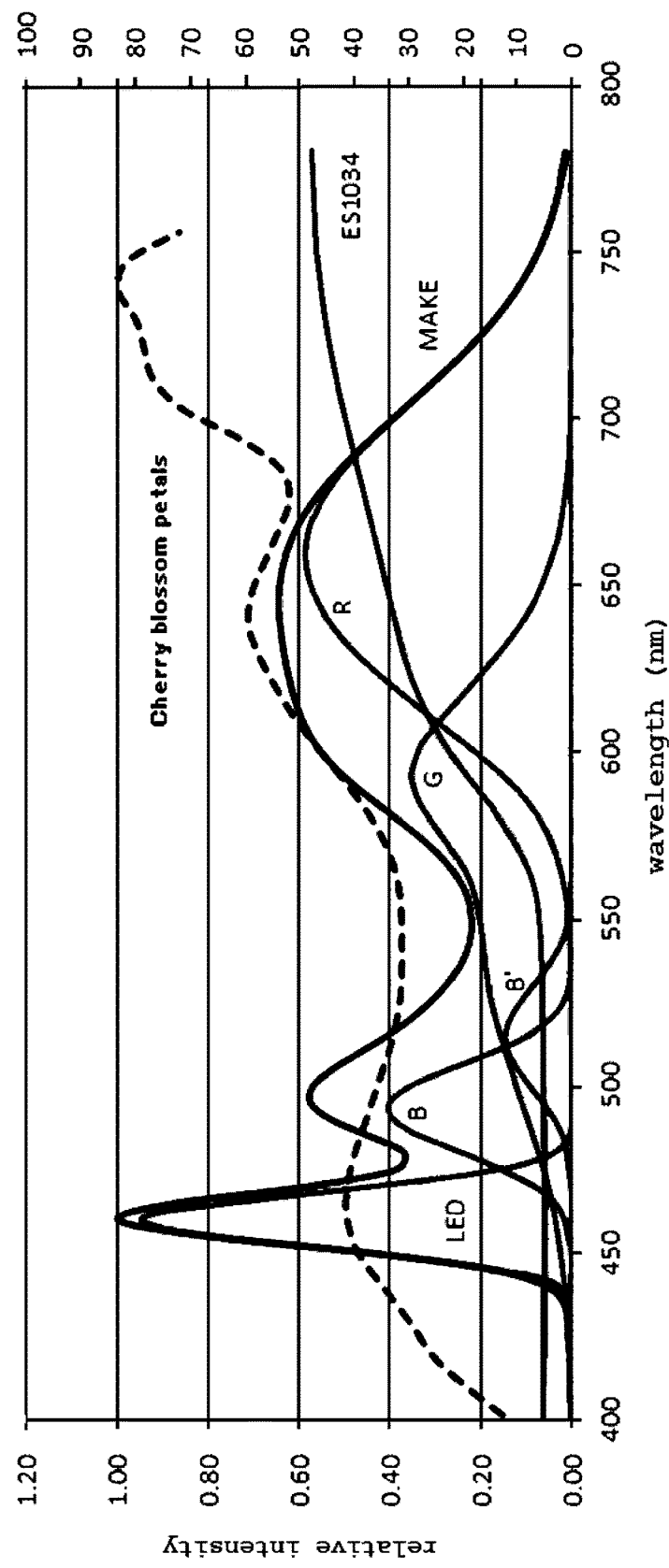
FIG. 14 shows an emission spectrum of an LED device, obtained by reproducing a reflection spectrum of pink (cherry blossom pink) cherry blossom petals using a blue LED element.

In FIGS. 13 and 14, "MAKE" indicates composite spectra indicating the emission of the obtained cherry blossom pink color LED devices. "LED" indicates the emission spectrum of the blue LED device, and the reference characters indicate the fluorescence spectra of the respective fluorescent substances. In FIGS. 13 and 14, "Cherry blossom petals" indicates the reflection spectrum of the surface of the cherry blossom pink color cherry blossom petals shown in FIG. 12. As shown in FIGS. 13 and 14, the emission spectra of the obtained cherry blossom pink color LED devices exhibited a composite spectrum resembling the spectrum of the surface of the cherry blossom petals shown in FIG. 12. The chromaticity coordinates (X, Y) in the XYZ colorimetric system were near (0.369, 0.316) which represented cherry blossom pink color, and were similar to those of the surface of the cherry blossom petals.

Example 5

The surface of pink cosmos petals was spectroscopically measured in the same manner as in Example 1. The obtained reflection spectrum is shown in FIG. 15. As shown in FIG. 15, when the maximum reflectance at 738 nm was taken as a relative intensity of 1.0, the reflection spectrum of the surface of the pink cosmos petals exhibited a relative intensity of 0.01 near 384 nm as the minimum reflectance, and exhibited a spectrum indicating peaks of a relative intensity of 0.50 near 475 nm, a relative intensity of 0.14 near 562 nm, a relative intensity of 0.85 near 668 nm, a relative intensity of 0.82 near 690 nm, and a relative intensity of 0.86 near 705 nm. The chromaticity coordinates (X, Y) in the XYZ colorimetric system were (0.366, 0.263), which represented pink.

With reference to the measured reflection spectrum, the color of the light of the near-ultraviolet LED device was adjusted to pink in the following manner. Specifically, a fluorescent substance sheet for being attached to the near-ultraviolet LED device and including a plurality of fluorescent substances blended therein was prepared. The blue fluorescent substance UVB, the green fluorescent substance G, and the red fluorescent substance RRR were uniformly dispersed in a silicone rubber at a predetermined blending ratio, to produce a fluorescent substance sheet having a thickness of 0.5 mm.

Similarly, with reference to the measured reflection spectrum, the color of the light of the blue LED device was adjusted to pink in the following manner. Specifically, the blue-green fluorescent substance B, the green fluorescent substance B', and the red fluorescent substance RR were uniformly dispersed in a silicone rubber at a predetermined blending ratio, to produce a fluorescent substance sheet having a thickness of 0.5 mm.

Figure 16:
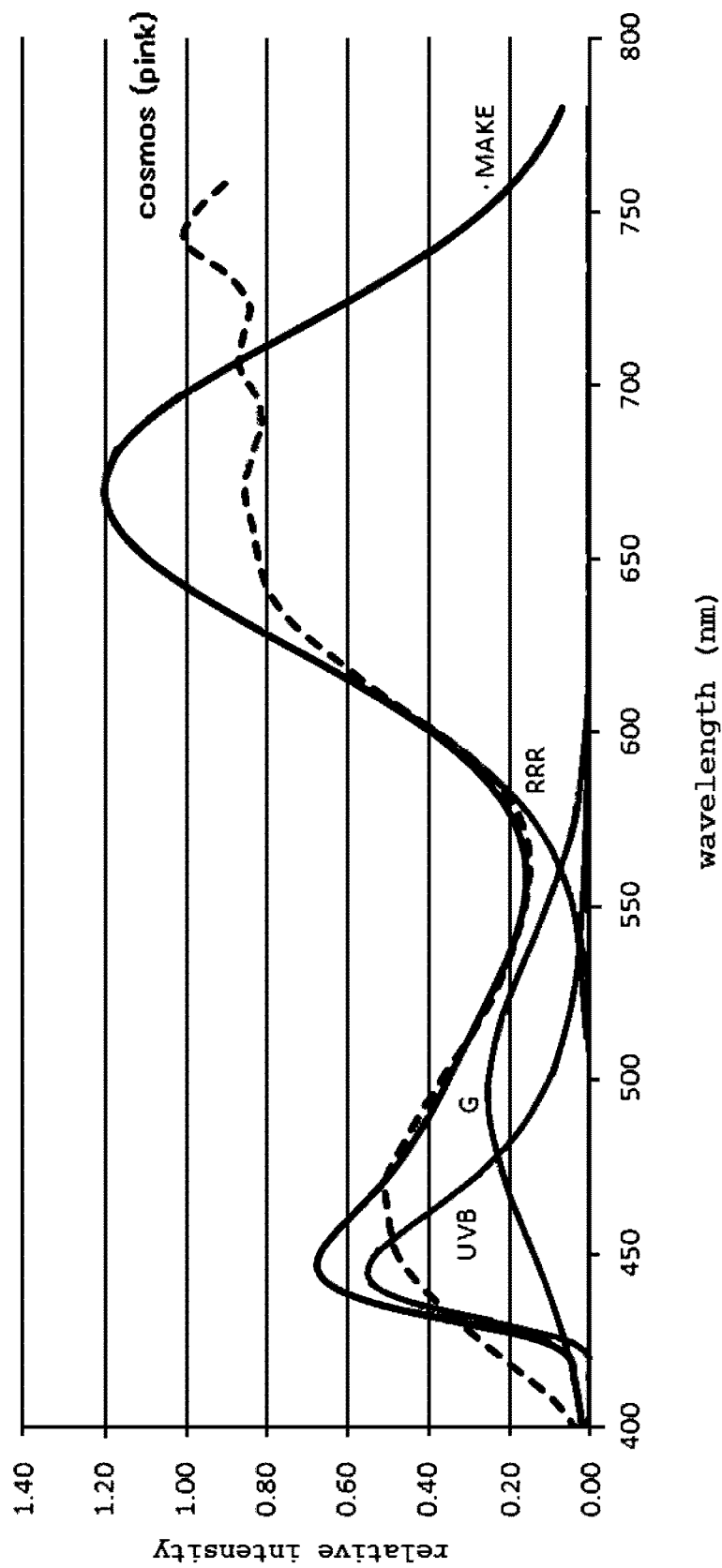
FIG. 16 shows an emission spectrum of an LED device, obtained by reproducing a reflection spectrum of pink cosmos petals using an ultraviolet LED element.

Then, the fluorescent substance sheets were bonded to the respective LED devices, to obtain pink LED devices. Spectroscopic measurement for obtaining the emission spectra of the obtained pink LED devices was performed. The emission spectrum of the pink LED device obtained using the near-ultraviolet LED device is shown in FIG. 16. The emission spectrum of the pink LED device obtained using the blue LED device is shown in FIG. 17.

Figure 17:
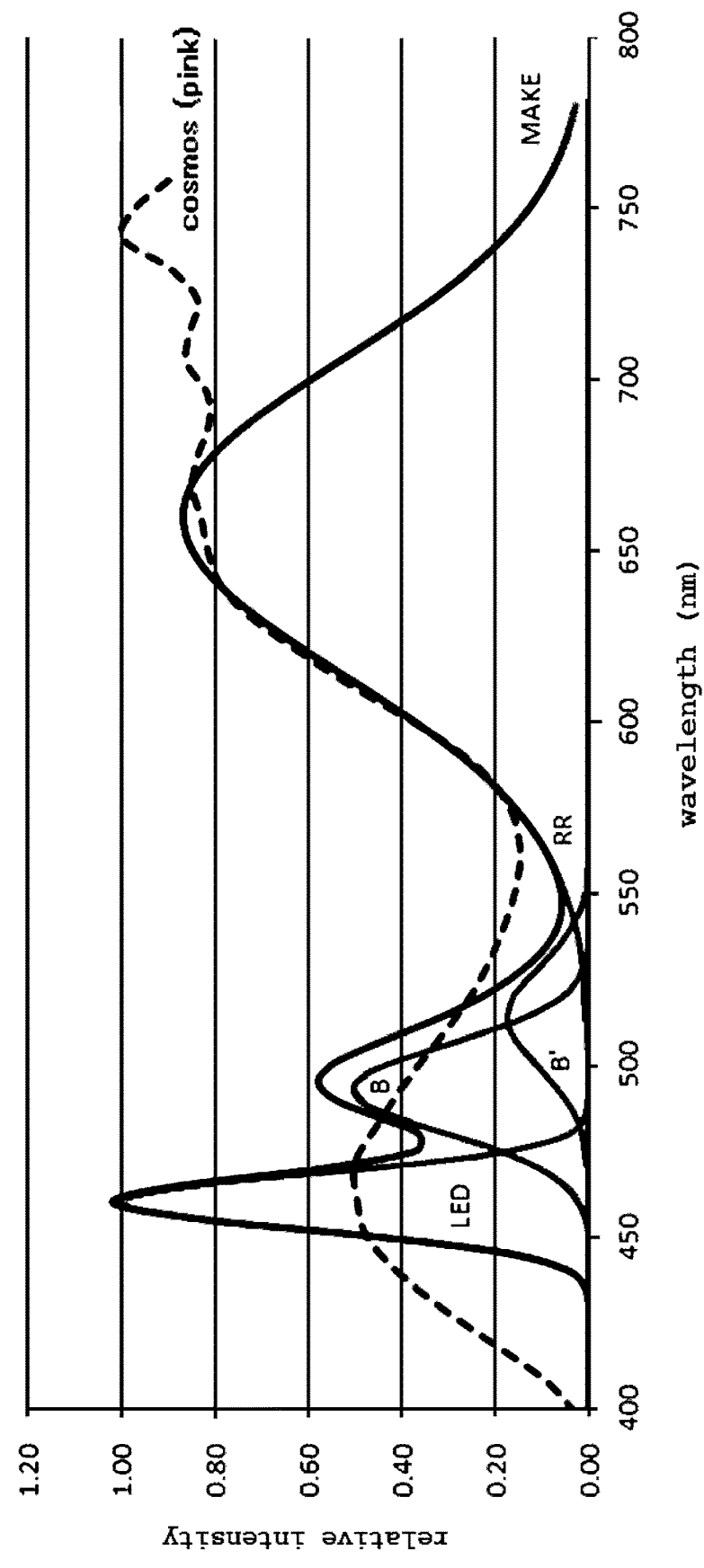
FIG. 17 shows an emission spectrum of an LED device, obtained by reproducing a reflection spectrum of pink cosmos petals using a blue LED element.

In FIGS. 16 and 17, "MAKE" indicates composite spectra indicating the emission of the obtained pink LED devices. "LED" indicates the emission spectrum of the blue LED device, and the reference characters indicate the fluorescence spectra of the respective fluorescent substances. In FIGS. 16 and 17, "cosmos (pink)" indicates the reflection spectrum of the surface of the pink cosmos petals shown in FIG. 15. As shown in FIGS. 16 and 17, the emission spectra of the obtained pink LED devices exhibited a composite spectrum resembling the spectrum of the surface of the pink cosmos petals shown in FIG. 15. The chromaticity coordinates (X, Y) in the XYZ colorimetric system were near (0.366, 0.260)), which represented pink, and were similar to those of the surface of the pink cosmos petals.

Example 6

The surface of red cosmos petals was spectroscopically measured in the same manner as in Example 1. The obtained reflection spectrum is shown in FIG. 18. As shown in FIG. 18, when the maximum reflectance at 738 nm was taken as a relative intensity of 1.0, the reflection spectrum of the surface of the red cosmos petals exhibited a relative intensity of 0.01 near 384 nm as the minimum reflectance, and exhibited a spectrum indicating peaks of a relative intensity of 0.15 near 475 nm, a relative intensity of 0.02 near 552 nm, a relative intensity of 0.68 near 676 nm, a relative intensity of 0.82 near 690 nm, and a relative intensity of 0.80 near 714 nm. The chromaticity coordinates (X, Y) in the XYZ colorimetric system were (0.440, 0.226), which represented red.

With reference to the measured reflection spectrum, the color of the light of the near-ultraviolet LED device was adjusted to red in the following manner. Specifically, a fluorescent substance sheet for being attached to the near-ultraviolet LED device and including a plurality of fluorescent substances blended therein was prepared. The blue fluorescent substance UVB and the red fluorescent substance RRR were uniformly dispersed in a silicone rubber at a predetermined blending ratio, to produce a fluorescent substance sheet having a thickness of 0.5 mm.

Similarly, with reference to the measured reflection spectrum, the color of the light of the blue LED device was adjusted to red in the following manner. Specifically, the red fluorescent substance RR was uniformly dispersed in a silicone rubber at a predetermined blending ratio, to produce a fluorescent substance sheet having a thickness of 0.5 mm.

Figure 19:
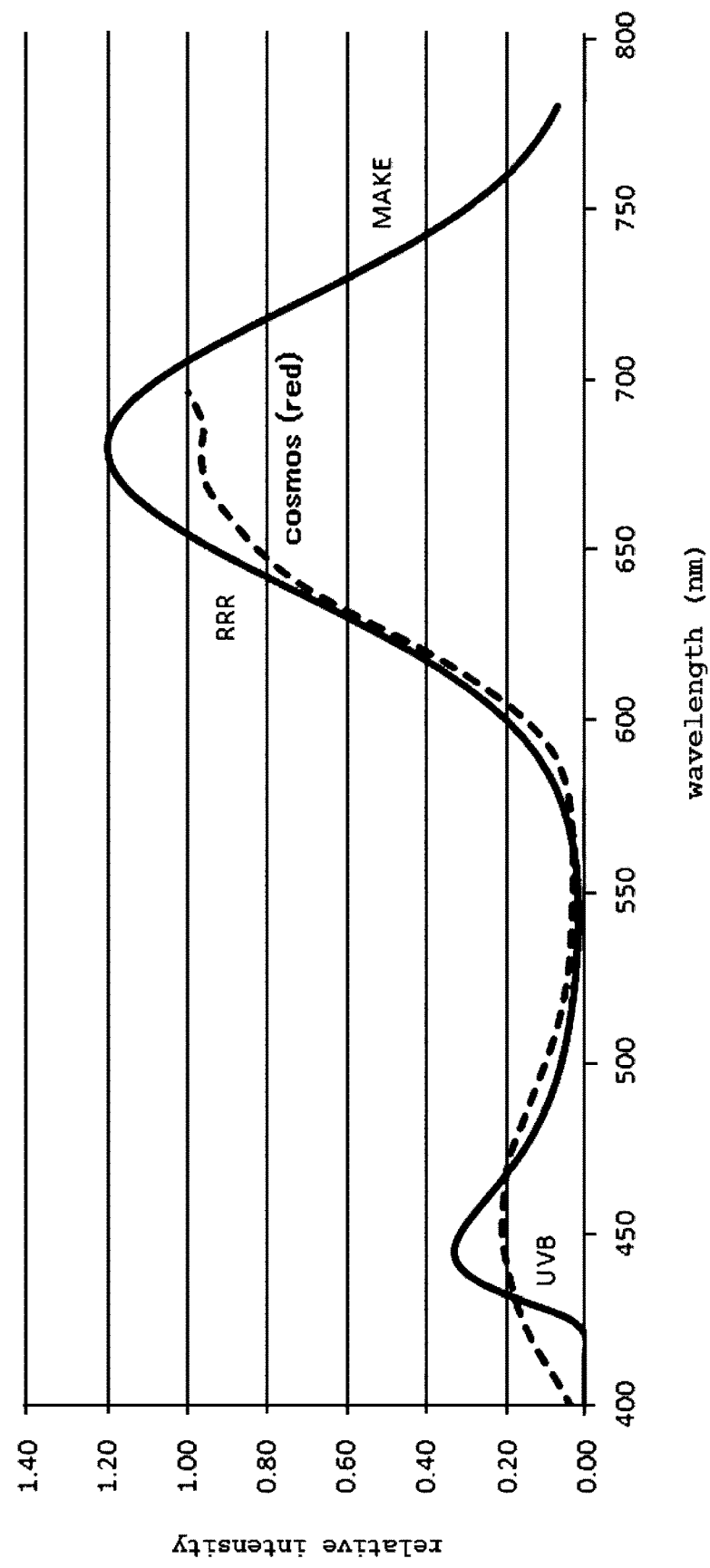
FIG. 19 shows an emission spectrum of an LED device, obtained by reproducing a reflection spectrum of red cosmos petals using an ultraviolet LED element.

Then, the fluorescent substance sheets were bonded to the respective LED devices, to obtain red LED devices. Spectroscopic measurement for obtaining the emission spectra of the obtained red LED devices was performed. The emission spectrum of the red LED device obtained using the near-ultraviolet LED device is shown in FIG. 19. The emission spectrum of the red LED device obtained using the blue LED device is shown in FIG. 20.

Figure 20:
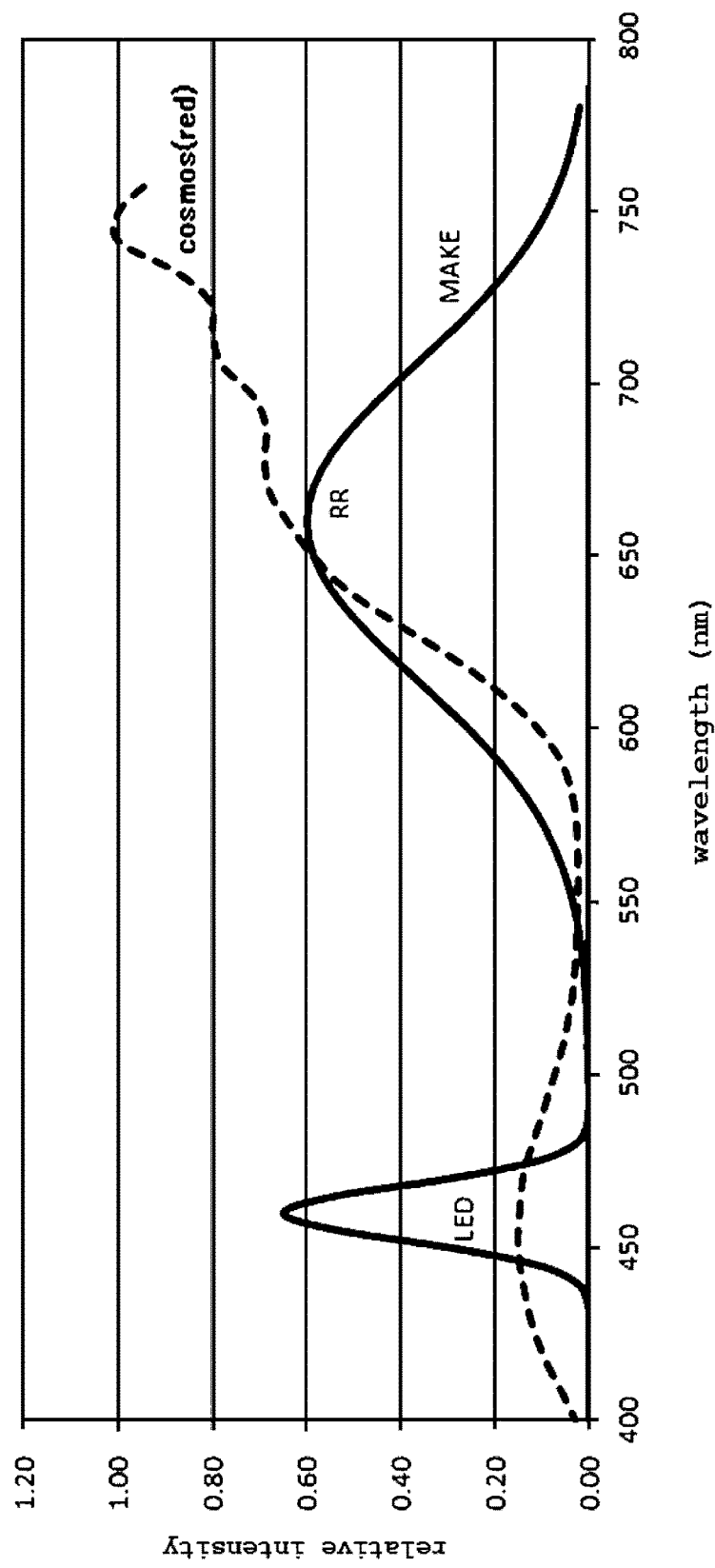
FIG. 20 shows an emission spectrum of an LED device, obtained by reproducing a reflection spectrum of red cosmos petals using a blue LED element.

In FIGS. 19 and 20, "MAKE" indicates composite spectra indicating the emission of the obtained red LED devices. "LED" indicates the emission spectrum of the blue LED device, and the reference characters indicate the fluorescence spectra of the respective fluorescent substances. In FIGS. 19 and 20, "cosmos (red)" indicates the reflection spectrum of the surface of the red cosmos petals shown in FIG. 18. As shown in FIGS. 19 and 20, the emission spectra of the obtained red LED devices exhibited a composite spectrum resembling the spectrum of the surface of the red cosmos petals shown in FIG. 18. The chromaticity coordinates (X, Y) in the XYZ colorimetric system were near (0.435, 0.227), which represented red, and were similar to those of the surface of the red cosmos petals.

Example 7

The surface of red autumn leaves was spectroscopically measured in the same manner as in Example 1. The obtained reflection spectrum is shown in FIG. 21. As shown in FIG. 21, when the maximum reflectance at 738 nm was taken as a relative intensity of 1.0, the reflection spectrum of the surface of the red autumn leaves exhibited a relative intensity of 0.03 near 389 nm as the minimum reflectance, and exhibited a spectrum indicating peaks of a relative intensity of 0.13 near 502 nm, a relative intensity of 0.37 near 560 nm, a relative intensity of 0.72 near 658 nm, a relative intensity of 0.78 near 695 nm, and a relative intensity of 0.85 near 703 nm. The chromaticity coordinates (X, Y) in the XYZ colorimetric system were (0.494, 0.323), which represented red.

With reference to the measured reflection spectrum, the color of the light of the near-ultraviolet LED device was adjusted to red in the following manner. Specifically, a fluorescent substance sheet for being attached to the near-ultraviolet LED device and including a plurality of fluorescent substances blended therein was prepared. The blue fluorescent substance UVB, the green fluorescent substance G, and the red fluorescent substance RRR were uniformly dispersed in a silicone rubber at a predetermined blending ratio, to produce a fluorescent substance sheet having a thickness of 0.5 mm.

Similarly, with reference to the measured reflection spectrum, the color of the light of the blue LED device was adjusted to yellow in the following manner. Specifically, the blue-green fluorescent substance B, the green fluorescent substance B', and the red fluorescent substance RR were uniformly dispersed in a silicone rubber at a predetermined blending ratio, to produce a fluorescent substance sheet having a thickness of 0.5 mm.

Figure 22:
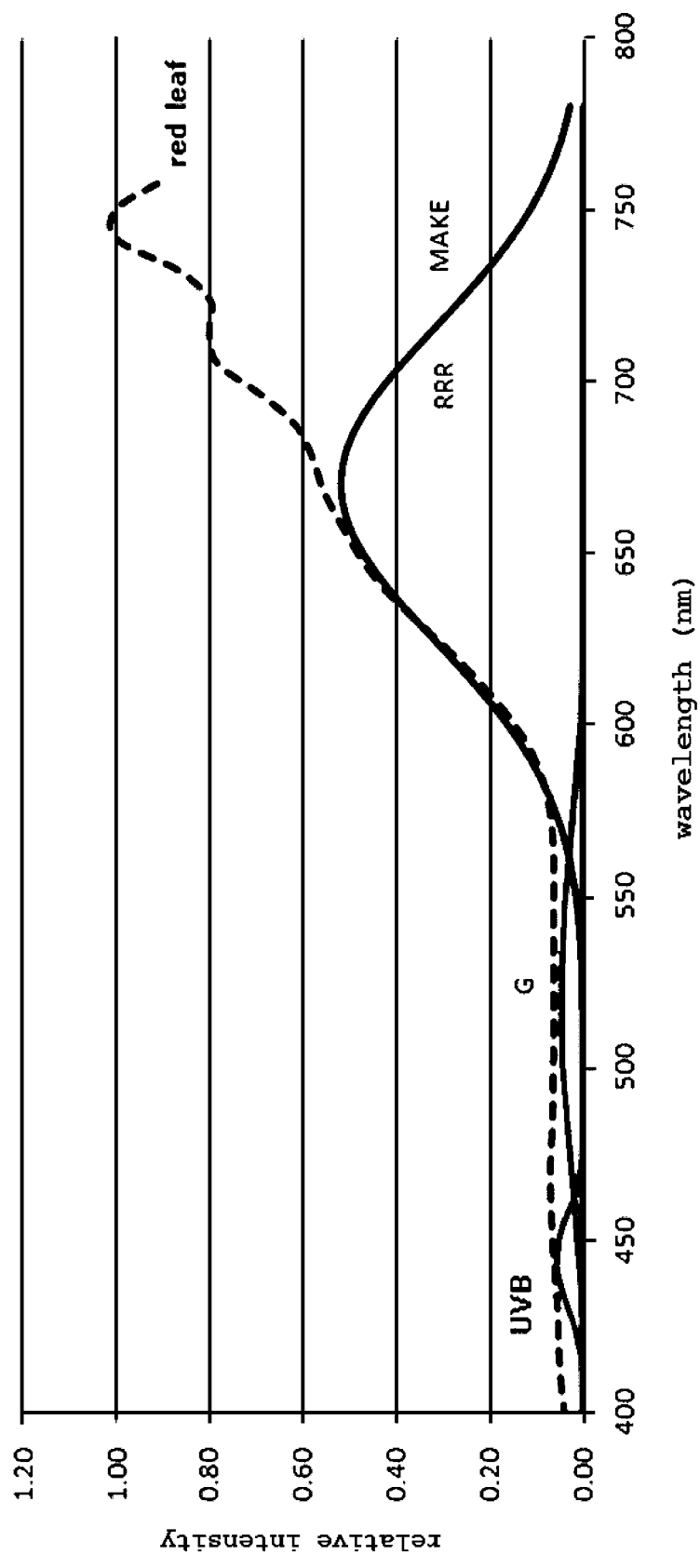
FIG. 22 shows an emission spectrum of an LED device, obtained by reproducing a reflection spectrum of red autumn leaves using an ultraviolet LED element.
Figure 23:
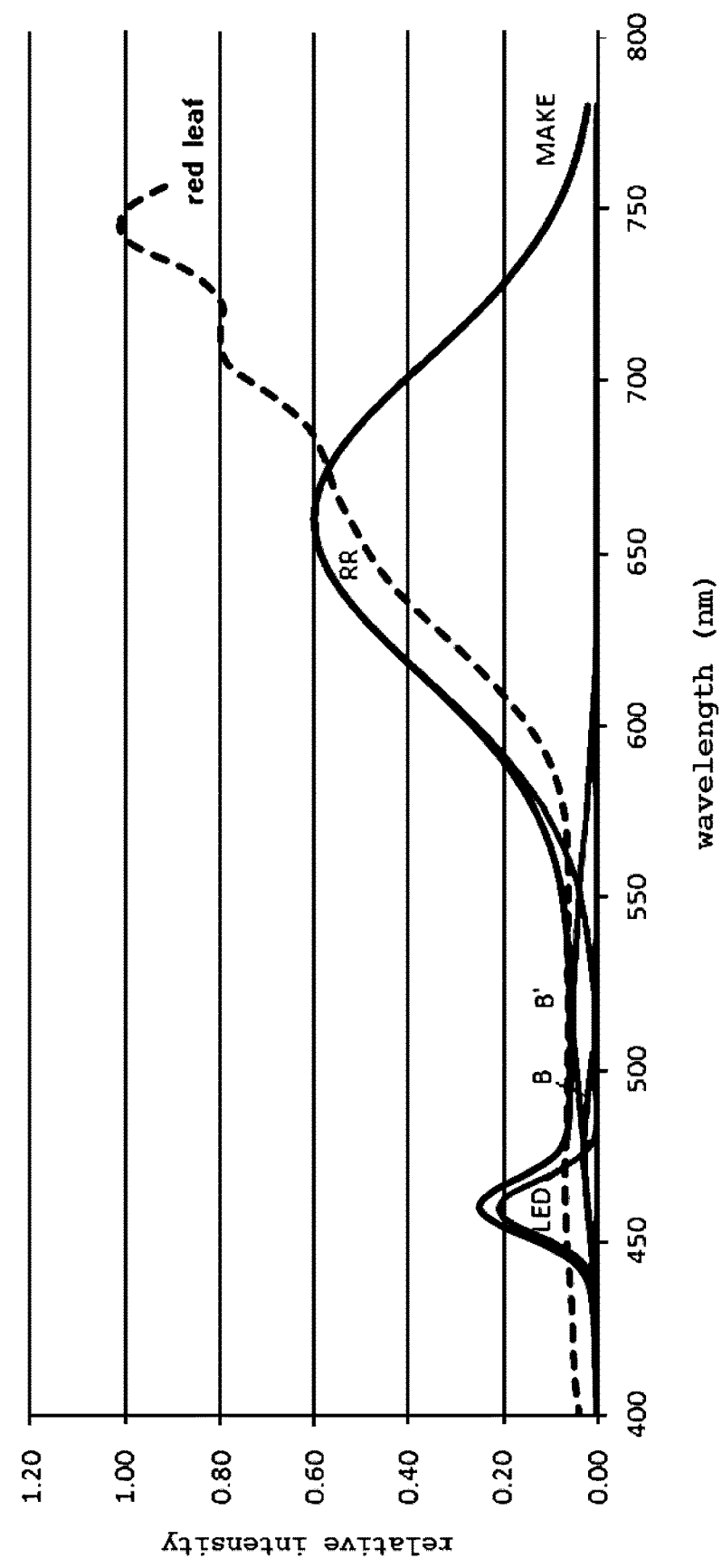
FIG. 23 shows an emission spectrum of an LED device, obtained by reproducing a reflection spectrum of red autumn leaves using a blue LED element.

Then, the fluorescent substance sheets were bonded to the respective LED devices, to obtain red LED devices. Spectroscopic measurement for obtaining the emission spectra of the obtained red LED devices was performed. The emission spectra of the obtained red LED devices are shown in FIGS. 22 and 23. In the drawings, "MAKE" indicates composite spectra indicating the emission of the obtained red LED devices. In the drawings, "red leaves" indicates the reflection spectrum of the surface of the red autumn leaves shown in FIG. 21. As shown in FIGS. 22 and 23, the emission spectra of the obtained red LED devices exhibited a composite spectrum resembling the spectrum of the surface of the red autumn leaves shown in FIG. 21. The chromaticity coordinates (X, Y) in the XYZ color colorimetric were near (0.494, 0.315), which represented red, and were similar to those of the surface of the red autumn leaves.

Example 8

The surface of yellow sunflower petals was spectroscopically measured in the same manner as in Example 1. The obtained reflection spectrum is shown in FIG. 24. As shown in FIG. 24, when the maximum reflectance at 738 nm was taken as a relative intensity of 1.0, the reflection spectrum of the surface of the yellow sunflower petals exhibited a relative intensity of 0.03 near 389 nm as the minimum reflectance, and exhibited a spectrum indicating peaks of a relative intensity of 0.13 near 502 nm, a relative intensity of 0.58 near 582 nm, a relative intensity of 0.62 near 621 nm, a relative intensity of 0.52 near 677 nm, and a relative intensity of 0.80 near 723 nm. The chromaticity coordinates (X, Y) in the XYZ colorimetric system were (0.521, 0.461), which represented yellow.

With reference to the measured reflection spectrum, the color of the light of the near-ultraviolet LED device was adjusted to yellow in the following manner. Specifically, the yellow fluorescent substance Y and the red fluorescent substance RR were uniformly dispersed in a silicone rubber at a predetermined blending ratio, to produce a fluorescent substance sheet having a thickness of 0.5 mm.

Figure 25:
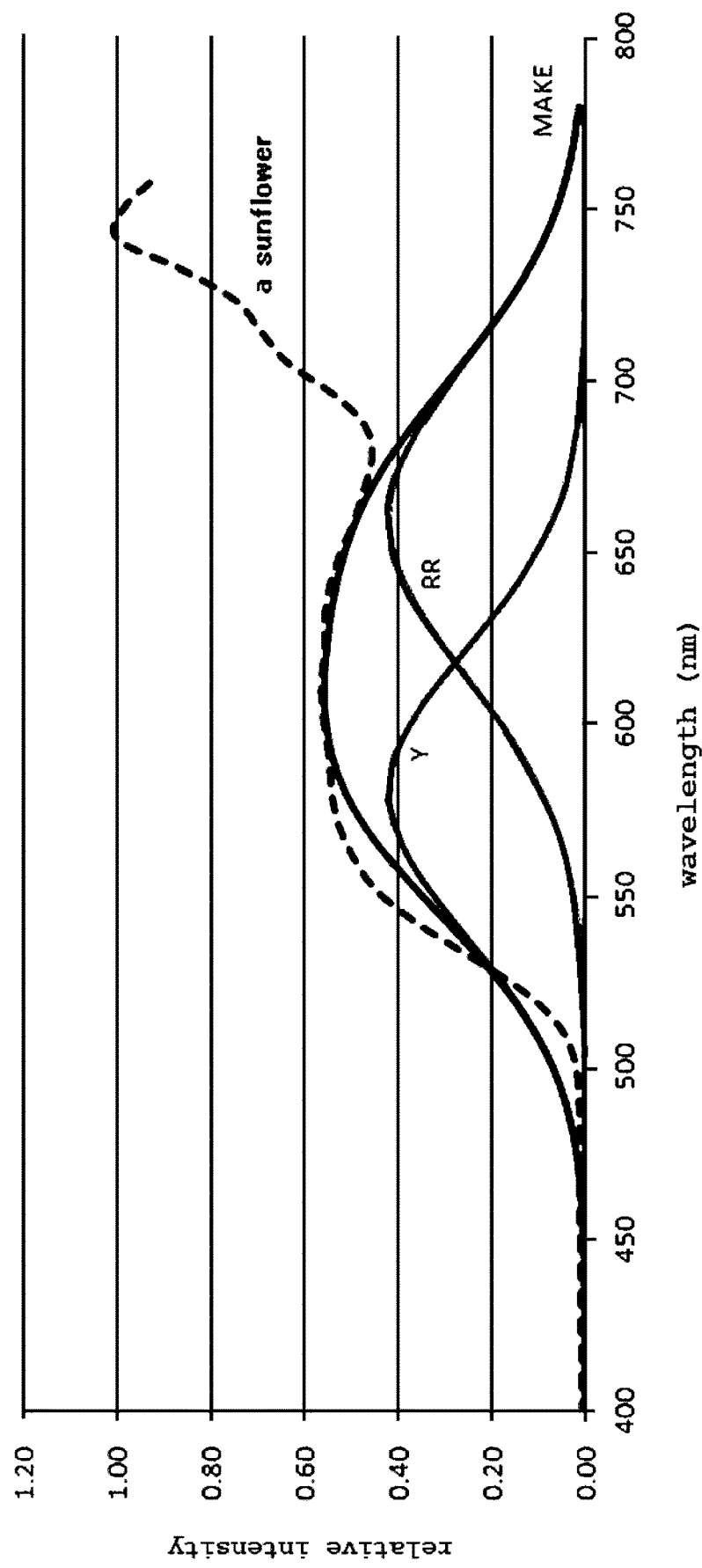
FIG. 25 shows an emission spectrum of an LED device, obtained by reproducing a reflection spectrum of yellow sunflowers using an ultraviolet LED element.

The fluorescent substance sheet was bonded to the near-ultraviolet LED device, to obtain a yellow LED device. Then, spectroscopic measurement for obtaining the emission spectrum of the obtained yellow LED device was performed. The emission spectrum of the obtained yellow LED device is shown in FIG. 25. In FIG. 25, "MAKE" indicates a composite spectrum indicating the emission of the obtained yellow LED device. In FIG. 25, "sunflowers" indicates the reflection spectrum of the surface of the yellow sunflower petals shown in FIG. 25. As shown in FIG. 25, the emission spectrum of the obtained yellow LED device exhibited a composite spectrum resembling the spectrum of the surface of the yellow sunflower petals shown in FIG. 25. The chromaticity coordinates (X, Y) in the XYZ colorimetric system were (0.522, 0.460), which represented yellow, and were similar to those of the surface of the yellow sunflowers.

Example 9

The surface of yellow ears of rice plants was spectroscopically measured in the same manner as in Example 1. The obtained reflection spectrum is shown in FIG. 26. As shown in FIG. 26, when the maximum reflectance at 738 nm was taken as a relative intensity of 1.0, the reflection spectrum of the surface of the yellow ears of rice plants exhibited a relative intensity of 0.05 near 389 nm as the minimum reflectance, and exhibited a spectrum indicating peaks of a relative intensity of 0.35 near 502 nm, a relative intensity of 0.85 near 562 nm, a relative intensity of 0.61 near 686 nm, a relative intensity of 0.52 near 677 nm, and a relative intensity of 0.85 near 714 nm. The chromaticity coordinates (X, Y) in the XYZ colorimetric system were (0.421, 0.432), which represented yellow.

With reference to the measured reflection spectrum, the color of the light of the near-ultraviolet LED device was adjusted to yellow in the following manner. Specifically, a fluorescent substance sheet for being attached to the near-ultraviolet LED device and including a plurality of fluorescent substances blended therein was prepared. The blue fluorescent substance UVB, the green fluorescent substance BG, the yellow fluorescent substance Y, and the red fluorescent substance RR were uniformly dispersed in a silicone rubber at a predetermined blending ratio, to produce a fluorescent substance sheet having a thickness of 0.5 mm.

Similarly, with reference to the measured reflection spectrum, the color of the light of the blue LED device was adjusted to yellow in the following manner. Specifically, the blue-green fluorescent substance B, the yellow fluorescent substance Y, and the red fluorescent substance R were uniformly dispersed in a silicone rubber at a predetermined blending ratio, to produce a fluorescent substance sheet having a thickness of 0.5 mm.

Figure 27:
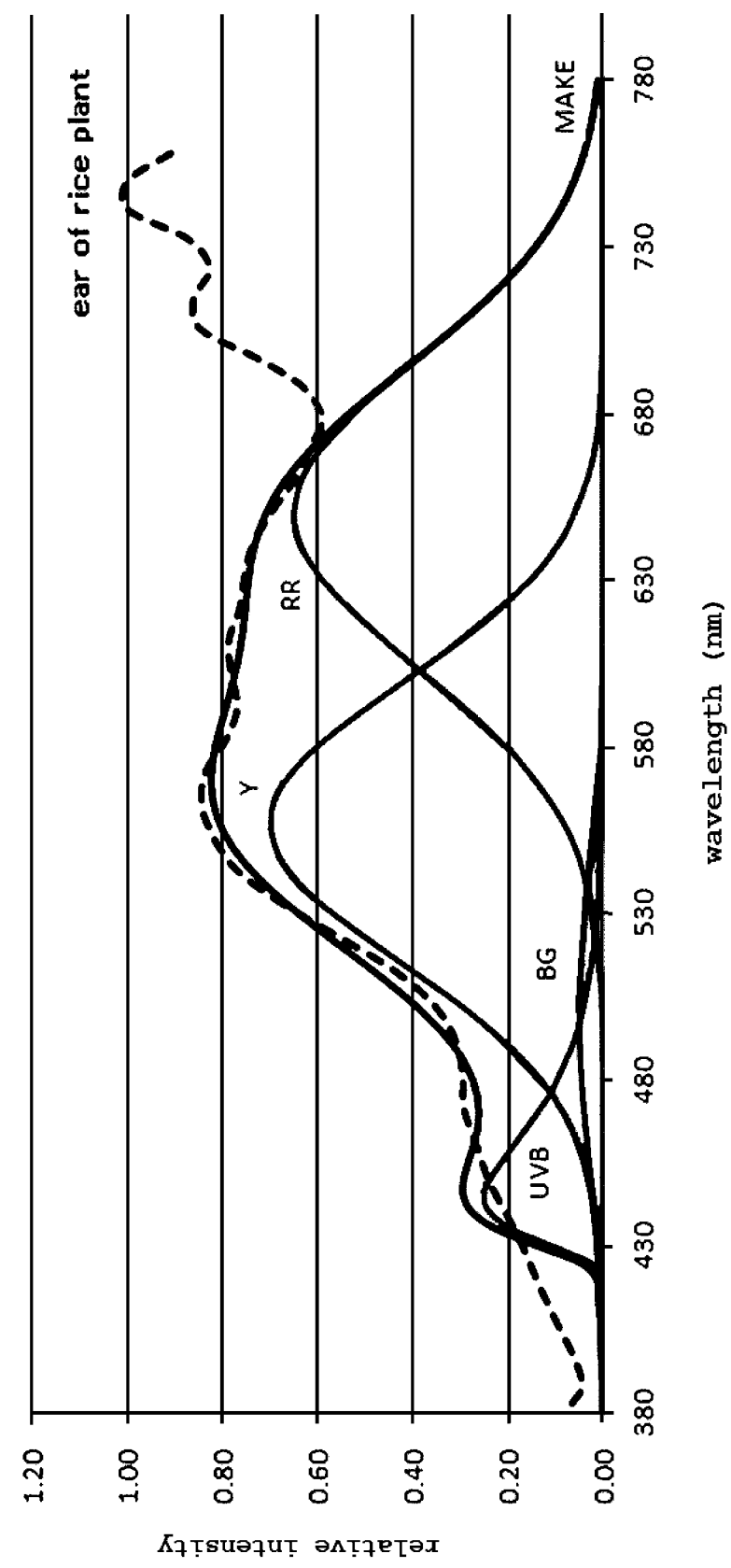
FIG. 27 shows an emission spectrum of an LED device, obtained by reproducing a reflection spectrum of yellow ears of rice plants using an ultraviolet LED element.
Figure 28:
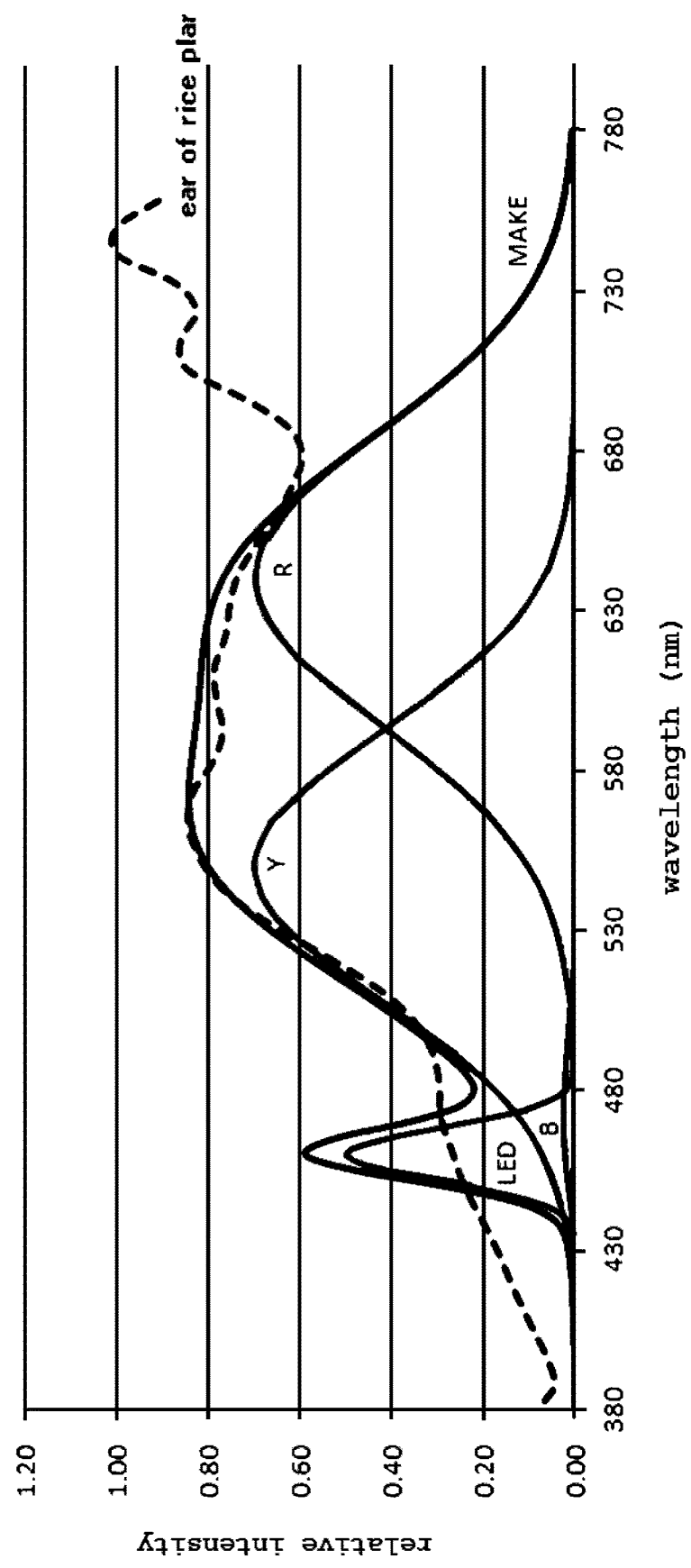
FIG. 28 shows an emission spectrum of an LED device, obtained by reproducing a reflection spectrum of yellow ears of rice plants using a blue LED element.

Then, the fluorescent substance sheets were bonded to the respective LED devices, to obtain yellow LED devices. Then, spectroscopic measurement for obtaining the emission spectra of the obtained yellow LED devices was performed. The emission spectra of the obtained yellow LED devices are shown in FIGS. 27 and 28. In the drawings, "MAKE" indicates composite spectra of the obtained yellow LED devices. In the drawings, "ears of rice plants" indicates the reflection spectrum of the surface of the yellow ears of rice plants shown in FIG. 26. As shown in FIGS. 27 and 28, the emission spectra of the obtained yellow LED devices exhibited a composite spectrum resembling the spectrum of the surface of the yellow ears of rice plants shown in FIG. 26. The chromaticity coordinates (X, Y) in the XYZ colorimetric system were near (0.420, 0.432), which represented yellow, and were similar to those of the surface of the yellow ears of rice plants.

REFERENCE SIGNS LIST

1. . . . LED element
2, 3. . . . Sealing resin
5. . . . Light-emitting substance housing member
5a, 5b . . . . Lead
6. . . . Gold wire
8. . . . Fluorescent substance-containing sheet
10, 20. . . . LED device
r, g. . . . Fluorescent substance

The invention claimed is:

1. A method for manufacturing an LED device, comprising:
   spectroscopically measuring a spectrum that constitutes a color of a measurement target that is a reflection spectrum for natural light; and
   adjusting a light emitted from the LED device such that an emission spectrum approximates the spectrum that constitutes the color of the measurement target,
   wherein the LED device includes an LED element, and two or more fluorescent substances having fluorescent wavelength peaks separated from each other by 50 nm or more.

2. The method for manufacturing the LED device according to claim 1,
   wherein the measurement target is at least one selected from a plant, a star, and a water surface.

3. The method for manufacturing the LED device according to claim 1,
   wherein the LED element is an ultraviolet LED element or a near-ultraviolet LED element having an emission peak in an ultraviolet light region of 430 nm or less, and at least one of the fluorescent substances is a blue fluorescent substance or a green fluorescent substance that can be excited by ultraviolet light or near-ultraviolet light emitted by the ultraviolet LED element or the near-ultraviolet LED element, and that has a fluorescent wavelength peak in a range of 420 to 480 nm.

4. The method for manufacturing the LED device according to claim 1,
   wherein the LED element is a blue LED element having an emission wavelength peak in a range of 430 nm or more and less than 480 nm.

5. The method for manufacturing the LED device according to claim 1,
   wherein the LED element is a green LED element having an emission wavelength peak in a range of 480 nm or more and 550 nm or less.

* * * * *